United States Patent
Chang

(10) Patent No.: US 9,046,911 B2
(45) Date of Patent: Jun. 2, 2015

(54) VARIABLE VOLTAGE GENERATION CIRCUIT

(75) Inventor: Yen-An Chang, Miaoli County (TW)

(73) Assignee: Etron Technology, Inc., Hsinchu (TW)

( * ) Notice: Subject to any disclaimer, the term of this patent is extended or adjusted under 35 U.S.C. 154(b) by 280 days.

(21) Appl. No.: 13/482,996

(22) Filed: May 29, 2012

(65) Prior Publication Data

US 2012/0326696 A1 Dec. 27, 2012

(30) Foreign Application Priority Data

Jun. 24, 2011 (TW) .............................. 100122261 A

(51) Int. Cl.
*G05F 1/575* (2006.01)
*H03F 3/45* (2006.01)

(52) U.S. Cl.
CPC ............ *G05F 1/575* (2013.01); *H03F 3/45475* (2013.01); *H03F 2203/45522* (2013.01); *H03F 2203/45528* (2013.01); *H03F 2203/45534* (2013.01)

(58) Field of Classification Search
USPC ........................... 323/273–281, 353, 354, 233
See application file for complete search history.

(56) References Cited

U.S. PATENT DOCUMENTS 7,619,402 B1 * 11/2009 Kwong ..................... 323/369
2010/0026252 A1 2/2010 Lin

FOREIGN PATENT DOCUMENTS

CN 201152948 Y 11/2008

* cited by examiner

*Primary Examiner* — Harry Behm
*Assistant Examiner* — Matthew Grubb
(74) *Attorney, Agent, or Firm* — Winston Hsu; Scott Margo

(57) ABSTRACT

A variable voltage generation circuit includes an amplifier, a P-type metal-oxide-semiconductor transistor, at least one variable resistor, and a lower resistor. Each variable resistor includes M resistors and M switches. An $i^{th}$ switch of the M switches has a first terminal coupled to a first terminal of the variable resistor, and a second terminal. An $i^{th}$ resistor has a first terminal coupled to the second terminal of the $i^{th}$ switch, and a second terminal coupled to a first terminal of an $(i+1)^{th}$ resistor, where $2 \leq M$, $1 \leq i \leq M$, and i and M are natural numbers. Therefore, the variable voltage generation circuit outputs at least one variable voltage according to a reference voltage, the at least one variable resistor, and the lower resistor.

21 Claims, 23 Drawing Sheets

VARIABLE VOLTAGE GENERATION CIRCUIT

BACKGROUND OF THE INVENTION

1. Field of the Invention

The present invention is related to a variable voltage generation circuit, and particularly to a variable voltage generation circuit that can generate at least one variable voltage according to at least one variable resistor.

2. Description of the Prior Art

Please refer to FIG. 1. FIG. 1 is a diagram illustrating a variable voltage generation circuit 100 according to the prior art. The variable voltage generation circuit 100 includes an amplifier 102, a P-type metal-oxide-semiconductor transistor 104, an upper resistor RU, a lower resistor RD, a resistor R0, and a variable resistor 106, where the variable resistor 106 includes a plurality of series resistors R1-Rn and a plurality of series switches S1-Sn, and each resistor is parallel with a switch.

As shown in FIG. 1, when the plurality of series switches S1-Sn are all turned off, a variable voltage VINTREF is determined by equation (1):

$$VINTREF = IREF*((R1+R2+\ldots+Rn)+RU+RD)$$
$$IREF = VREF/RD \quad (1)$$

When the switch S1 is turned on and the switches S2-Sn are turned off, because a reference current IREF flows through the switch S1 instead of flowing through the resistor R1, a variable voltage VINTREF is determined by equation (2):

$$VINTREF = IREF*((R2+\ldots+Rn)+RU+RD) \quad (2)$$

Therefore, a user can adjust the variable voltage VINTREF generated by the variable voltage generation circuit 100 by controlling turning-on and turning-off of the plurality of series switches S1-Sn. However, because each resistor is parallel with a switch and internal resistance of each switch varies due to semiconductor process variation, voltage, and temperature, the variable voltage VINTREF generated by the variable voltage generation circuit 100 is more inaccurate when resistance of a resistor in parallel with a switch is low.

SUMMARY OF THE INVENTION

An embodiment provides a variable voltage generation circuit. The variable voltage generation circuit includes an amplifier, a P-type metal-oxide-semiconductor transistor, a first variable resistor, and a lower resistor. The amplifier has a first input terminal for receiving a first voltage, a second input terminal for receiving a reference voltage, a third input terminal, and an output terminal. The P-type metal-oxide-semiconductor transistor has a first terminal for receiving the first voltage, a second terminal coupled to the output terminal of the amplifier, and a third terminal. The first variable resistor has a first terminal coupled to the third terminal of the P-type metal-oxide-semiconductor transistor for outputting a first variable voltage, and a second terminal coupled to the third input terminal of the amplifier. The first variable resistor includes M resistors and M switches, where an $i^{th}$ switch of the M switches has a first terminal coupled to the first terminal of the first variable resistor, and a second terminal, where an $i^{th}$ resistor of the M resistors has a first terminal coupled to the second terminal of the $i^{th}$ switch, and a second terminal coupled to a second terminal of an $(i+1)^{th}$ resistor, where a second terminal of an $M^{th}$ resistor is coupled to the second terminal of the first variable resistor, $2 \leq M$, $1 \leq i \leq M$, and i and M are natural numbers. The lower resistor has a first terminal coupled to the third input terminal of the amplifier, and a second terminal coupled to ground.

Another embodiment provides a variable voltage generation circuit. The variable voltage generation circuit includes an amplifier, a P-type metal-oxide-semiconductor transistor, a first variable resistor, and a lower resistor. The amplifier has a first input terminal for receiving a first voltage, a second input terminal for receiving a reference voltage, a third input terminal, and an output terminal. The P-type metal-oxide-semiconductor transistor has a first terminal for receiving the first voltage, a second terminal coupled to the output terminal of the amplifier, and a third terminal. The first variable resistor has a first terminal coupled to the third terminal of the P-type metal-oxide-semiconductor transistor for outputting a first variable voltage, and a second terminal coupled to the third input terminal of the amplifier. The first variable resistor includes M−1 resistors and M switches, where an $i^{th}$ switch of the M switches has a first terminal coupled to the second terminal of the first variable resistor, and a second terminal, where an $i^{th}$ resistor of the M−1 resistors has a first terminal coupled to the second terminal of the $i^{th}$ switch, and a second terminal coupled to a second terminal of an $(i+1)^{th}$ switch. A first terminal of a first resistor is coupled to the first terminal of the first variable resistor, a first terminal of an $M^{th}$ switch is coupled to the second terminal of the first variable resistor, where $2 \leq M$, $1 \leq i \leq M-1$, and i and M are natural numbers. The lower resistor has a first terminal coupled to the third input terminal of the amplifier, and a second terminal coupled to ground.

The present invention provides a variable voltage generation circuit. The variable voltage generation circuit utilizes at least two parallel switches to choose resistance of at least one variable resistor for generating at least one variable voltage. Therefore, the present invention can improve on the disadvantage in the prior art of the at least one variable voltage varying with semiconductor process variation, voltage, and temperature due to each resistor being in parallel with a switch, thereby reducing influence of internal resistance of each switch, and generating the at least one variable voltage simultaneously.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
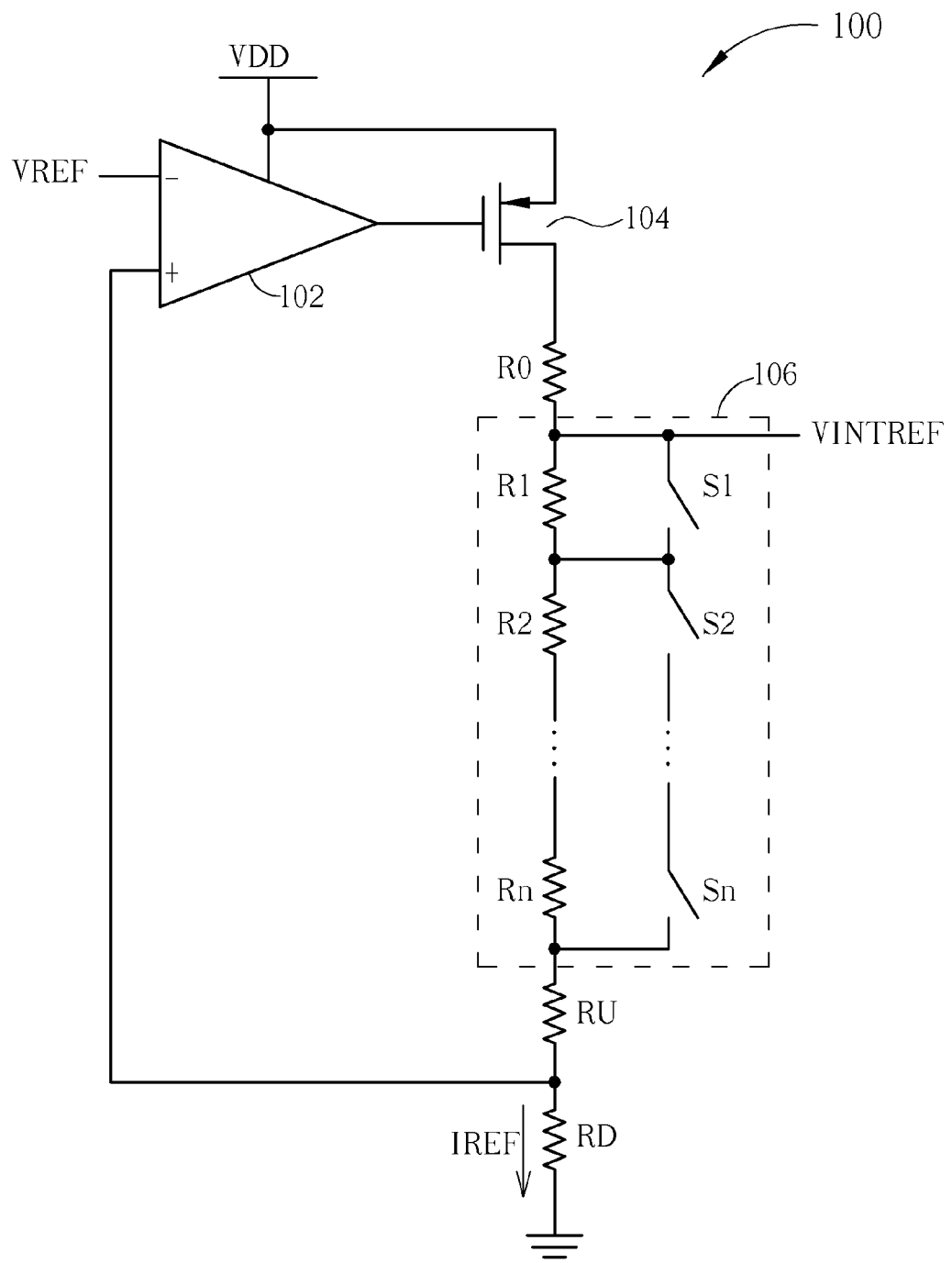
FIG. 1 is a diagram illustrating a variable voltage generation circuit according to the prior art.
Figure 2:
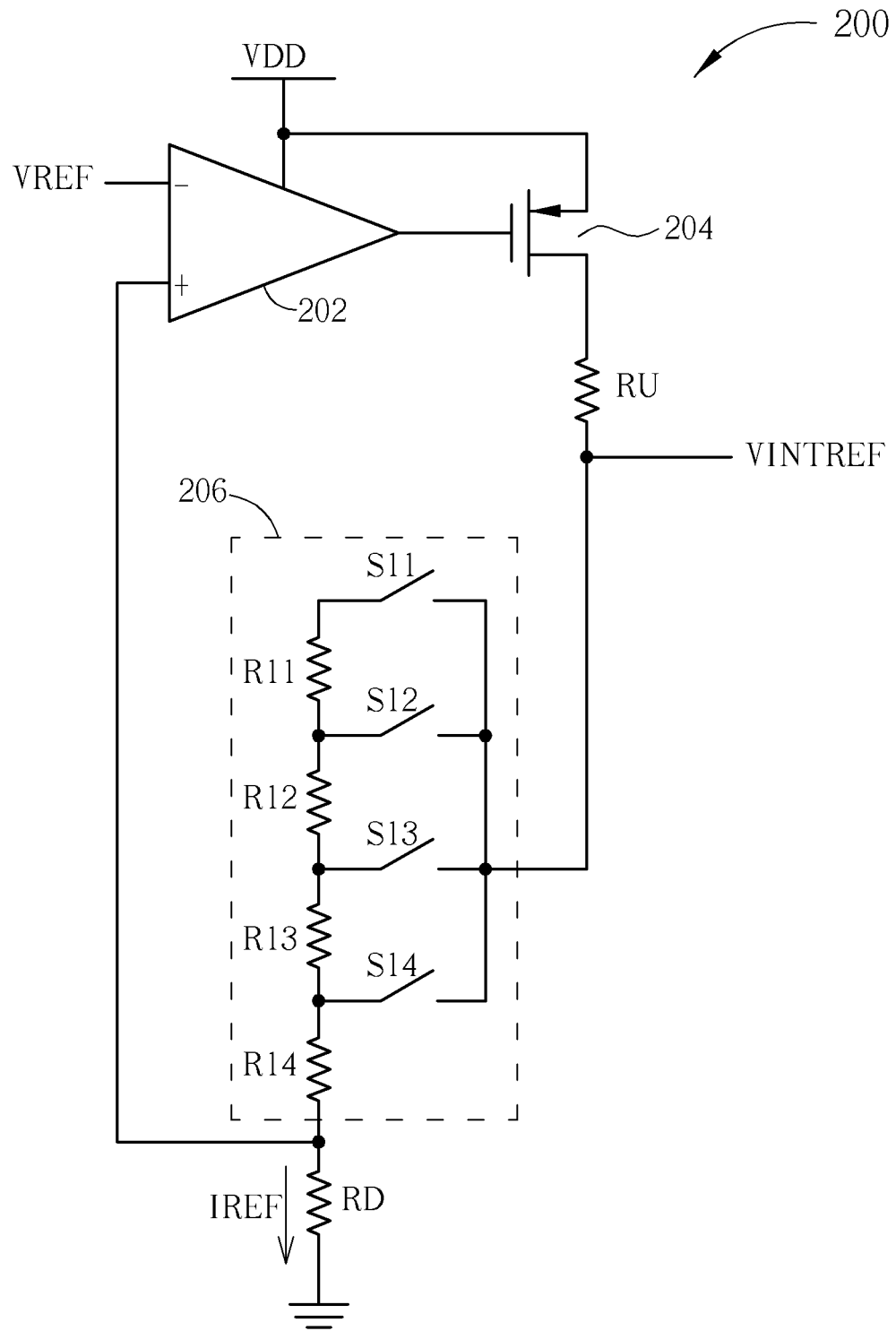
FIG. 2 is a diagram illustrating a variable voltage generation circuit according to an embodiment.

Please refer to FIG. 2. FIG. 2 is a diagram illustrating a variable voltage generation circuit 200 according to an embodiment. The variable voltage generation circuit 200 includes an amplifier 202, a P-type metal-oxide-semiconductor transistor 204, an upper resistor RU, a lower resistor RD, and a variable resistor 206. The amplifier 202 has a first input terminal for receiving a first voltage VDD, a second input terminal for receiving a reference voltage VREF, a third input terminal, and an output terminal. The P-type metal-oxide-semiconductor transistor 204 has a first terminal for receiving the first voltage VDD, a second terminal coupled to the output terminal of the amplifier 202, and a third terminal. The upper resistor RU has a first terminal coupled to the third terminal of the P-type metal-oxide-semiconductor transistor 204, and a second terminal for outputting a variable voltage VINTREF, where a resistance of the upper resistor RU can be zero. The lower resistor RD has a first terminal coupled to the third input terminal of the amplifier 202, and a second terminal coupled to ground. The variable resistor 206 has a first terminal coupled to the second terminal of the upper resistor RU, and a second terminal coupled to the third input terminal of the amplifier 202. In addition, the variable resistor 206 includes a first switch S11, a second switch S12, a third switch S13, a fourth switch S14, and a first resistor R11, a second resistor R12, a third resistor R13, a fourth resistor R14. A first terminal of the each switch is coupled to the first terminal of the variable resistor 206, and resistances of the first resistor R11, the second resistor R12, the third resistor R13, and the fourth resistor R14 are the same, not all the same, or different. A second terminal of the first switch S11 is coupled to a first terminal of the first resistor R11, a second terminal of the second switch S12 is coupled to a first terminal of the second resistor R12, a second terminal of the third switch S13 is coupled to a first terminal of the third resistor R13, and a second terminal of the fourth switch S14 is coupled to a first terminal of the fourth resistor R14. In addition, a second terminal of the first resistor R11 is coupled to the first terminal of the second resistor R12, a second terminal of the second resistor R12 is coupled to the first terminal of the third resistor R13, a second terminal of the third resistor R13 is coupled to the first terminal of the fourth resistor R14, and a second terminal of the fourth resistor R14 is coupled to the third input terminal of the amplifier 202. But, the variable resistor 206 of the present invention is not limited to 4 switches and 4 resistors. Any number of switches and resistors of the variable resistor 206 greater than two or equal to two falls within the scope of the present invention.

A reference current IREF is determined by equation (3):

$$IREF=VREF/RD \qquad (3)$$

Therefore, when the first switch S11 is turned on, and the second switch S12, the third switch S13, and the fourth switch S14 are turned off, a variable voltage VINTREF is determined by equation (4):

$$VINTREF=IREF*(RD+R11+R12+R13+R14) \qquad (4)$$

When the second switch S12 is turned on, and the third switch S13 and the fourth switch S14 are turned off, a variable voltage VINTREF is determined by equation (5):

$$VINTREF=IREF*(RD+R12+R13+R14) \qquad (5)$$

When the third switch S13 is turned on and the fourth switch S14 is turned off, a variable voltage VINTREF is determined by equation (6):

$$VINTREF=IREF*(RD+R13+R14) \qquad (6)$$

When the fourth switch S14 is turned on, a variable voltage VINTREF is determined by equation (7):

$$VINTREF=IREF*(RD+R14) \qquad (7)$$

Figure 3:
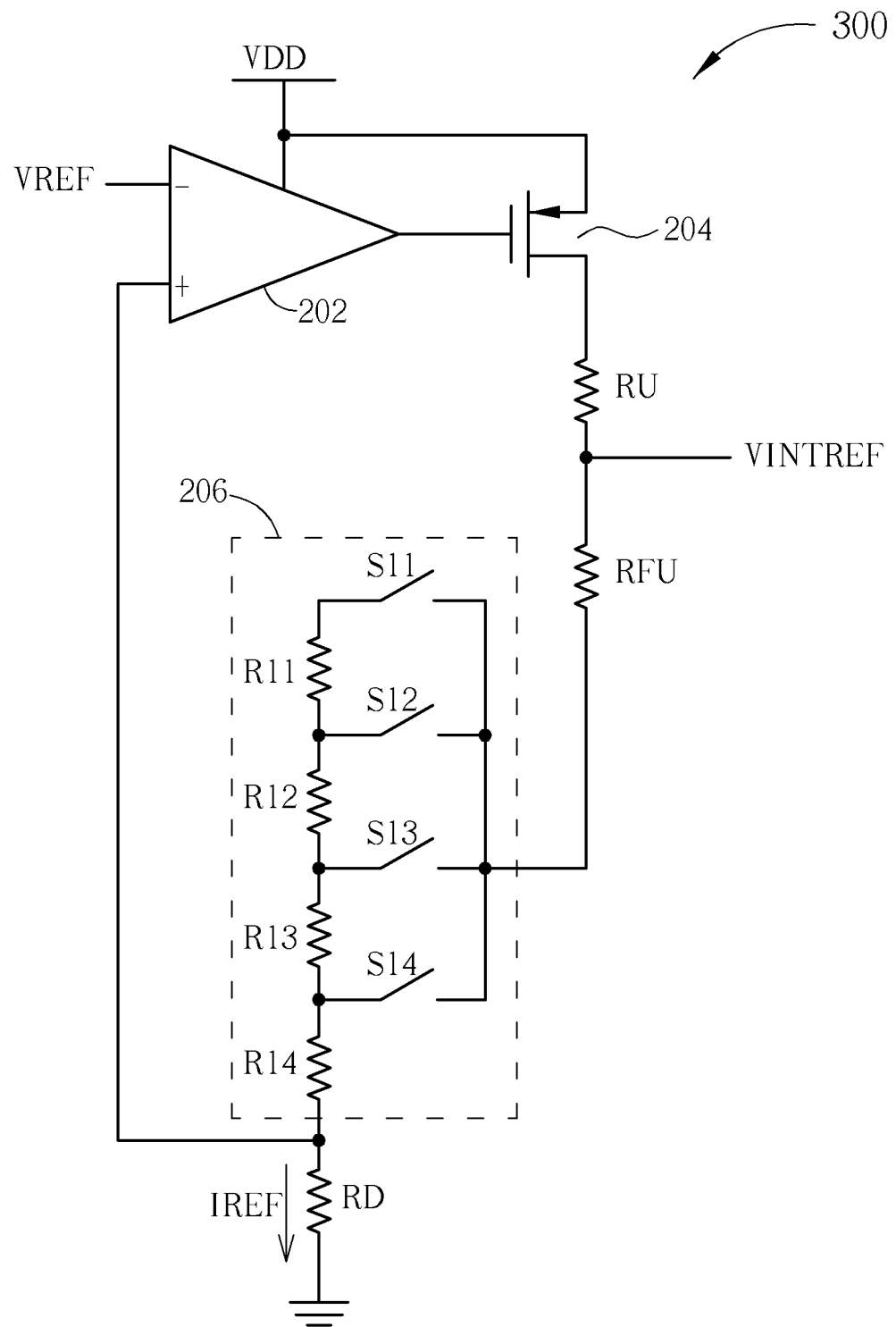
FIG. 3 is a diagram illustrating a variable voltage generation circuit according to another embodiment.

Please refer to FIG. 3. FIG. 3 is a diagram illustrating a variable voltage generation circuit 300 according to another embodiment. A difference between the variable voltage generation circuit 300 and the variable voltage generation circuit 200 is that the variable voltage generation circuit 300 further includes a first upper resistor RFU. The first upper resistor RFU has a first terminal coupled to the second terminal of the upper resistor RU, and a second terminal coupled to the first terminal of the variable resistor 206. Therefore, when the first switch S11 is turned on, and the second switch S12, the third switch S13, and the fourth switch S14 are turned off, a variable voltage VINTREF is determined by equation (8):

$$VINTREF=IREF*(RD+RFU+R11+R12+R13+R14) \qquad (8)$$

Further, subsequent operational principles of the variable voltage generation circuit 300 are the same as those of the variable voltage generation circuit 200, so further description thereof is omitted for simplicity.

Figure 4:
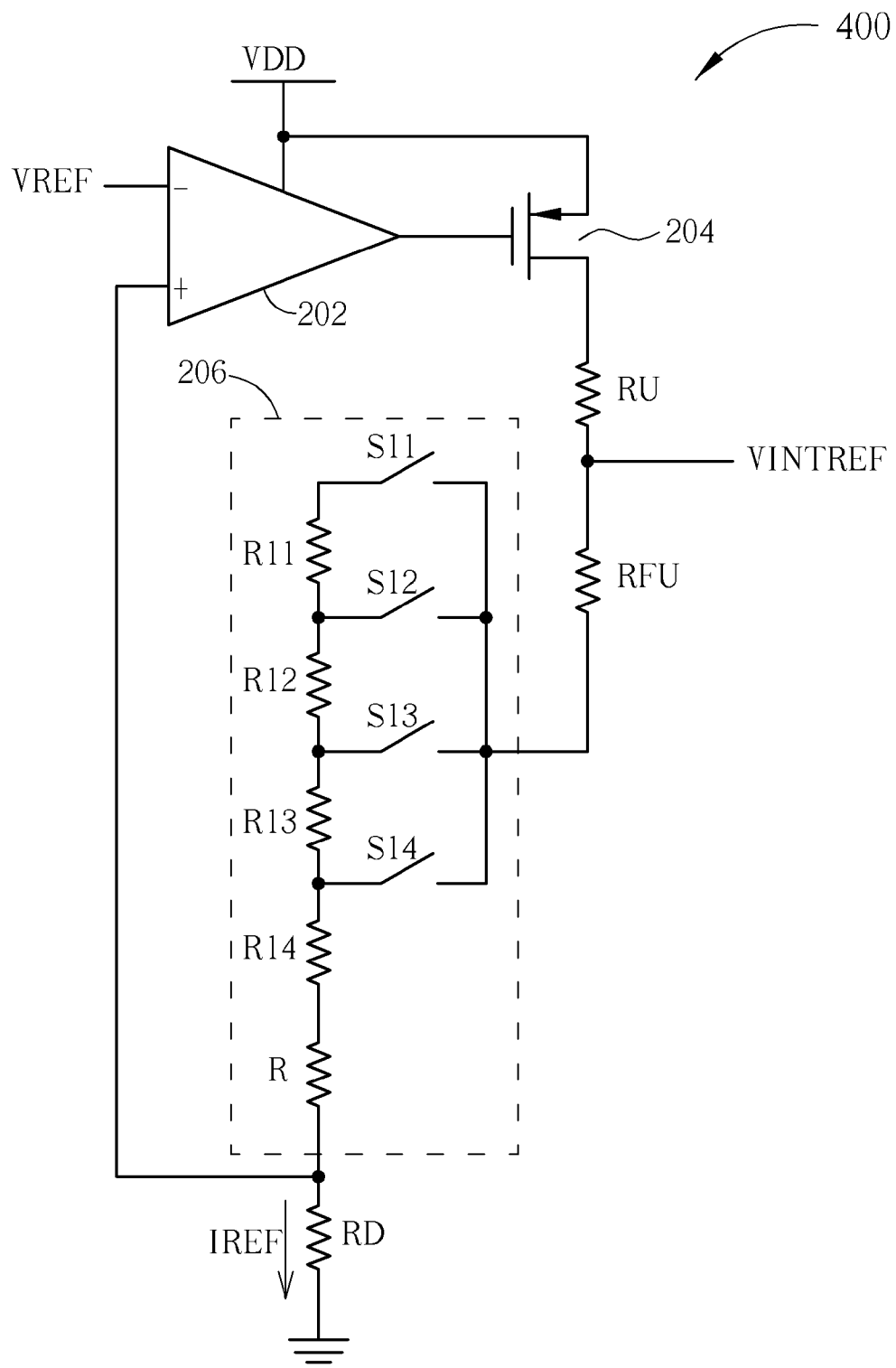
FIG. 4 is a diagram illustrating a variable voltage generation circuit according to another embodiment.

Please refer to FIG. 4. FIG. 4 is a diagram illustrating a variable voltage generation circuit 400 according to another embodiment. A difference between the variable voltage generation circuit 400 and the variable voltage generation circuit 300 is that the variable resistor 206 of the variable voltage generation circuit 400 further includes a resistor R. The resistor R has a first terminal coupled to the second terminal of the fourth resistor R14, and a second terminal coupled to the third input terminal of the amplifier 202. Therefore, when the first switch S11 turned on, and the second switch S12, the third switch S13, and the fourth switch S14 are turned off, a variable voltage VINTREF is determined by equation (9):

$$VINTREF=IREF*(RD+RFU+R+R11+R12+R13+R14) \qquad (9)$$

Further, subsequent operational principles of the variable voltage generation circuit 400 are the same as those of the variable voltage generation circuit 300, so further description thereof is omitted for simplicity.

Figure 5:
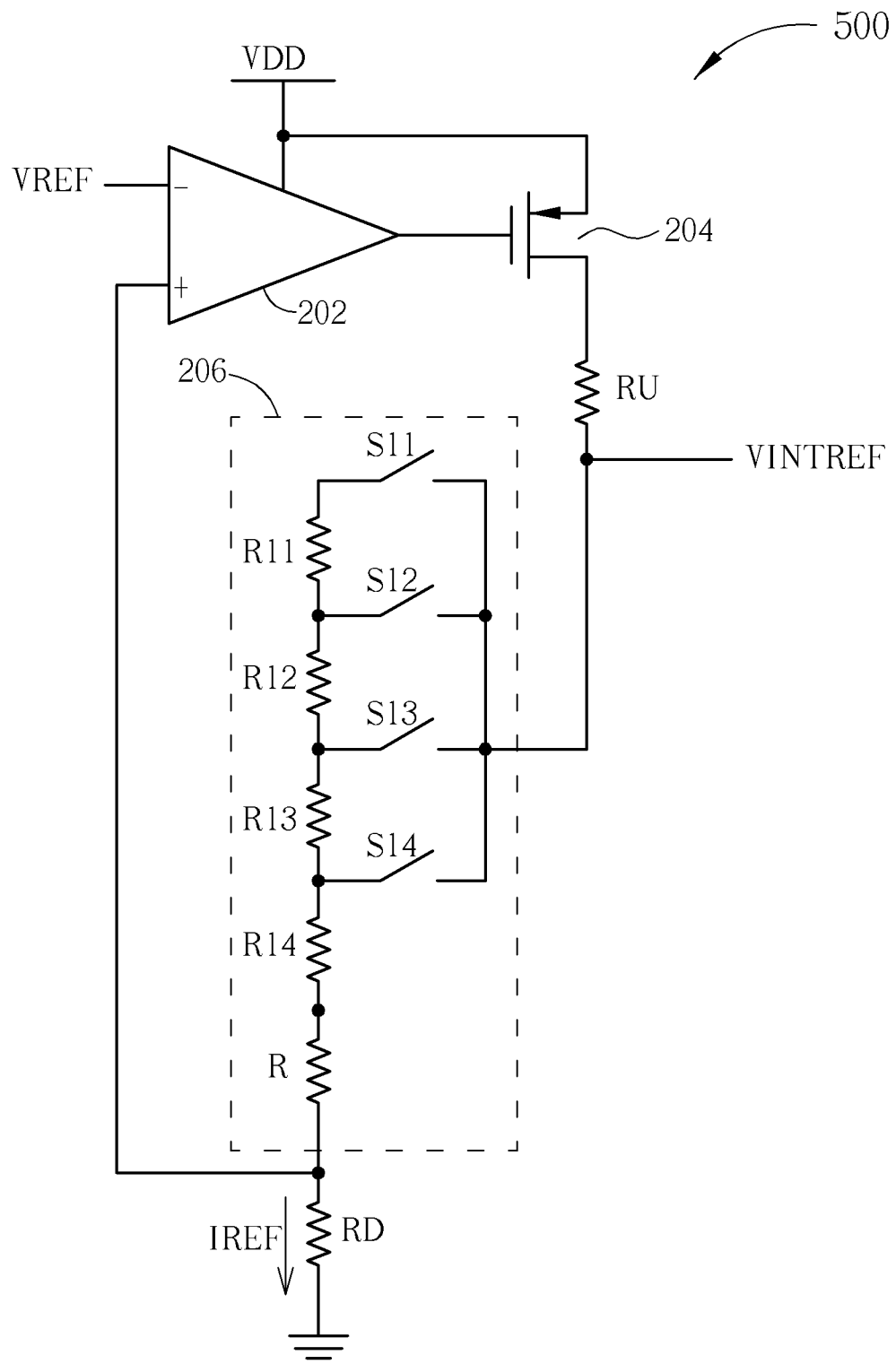
FIG. 5 is a diagram illustrating a variable voltage generation circuit according to another embodiment.

Please refer to FIG. 5. FIG. 5 is a diagram illustrating a variable voltage generation circuit 500 according to another embodiment. A difference between the variable voltage generation circuit 500 and the variable voltage generation circuit 200 is that the variable resistor 206 of the variable voltage generation circuit 500 further includes a resistor R. The resistor R has a first terminal coupled to the second terminal of the fourth resistor R14, and a second terminal coupled to the third input terminal of the amplifier 202. Therefore, when the first switch S11 turned on, and the second switch S12, the third switch S13, and the fourth switch S14 are turned off, a variable voltage VINTREF is determined by equation (10):

$$VINTREF=IREF*(RD+R+R11+R12+R13+R14) \qquad (10)$$

Further, subsequent operational principles of the variable voltage generation circuit 500 are the same as those of the variable voltage generation circuit 200, so further description thereof is omitted for simplicity.

Figure 6:
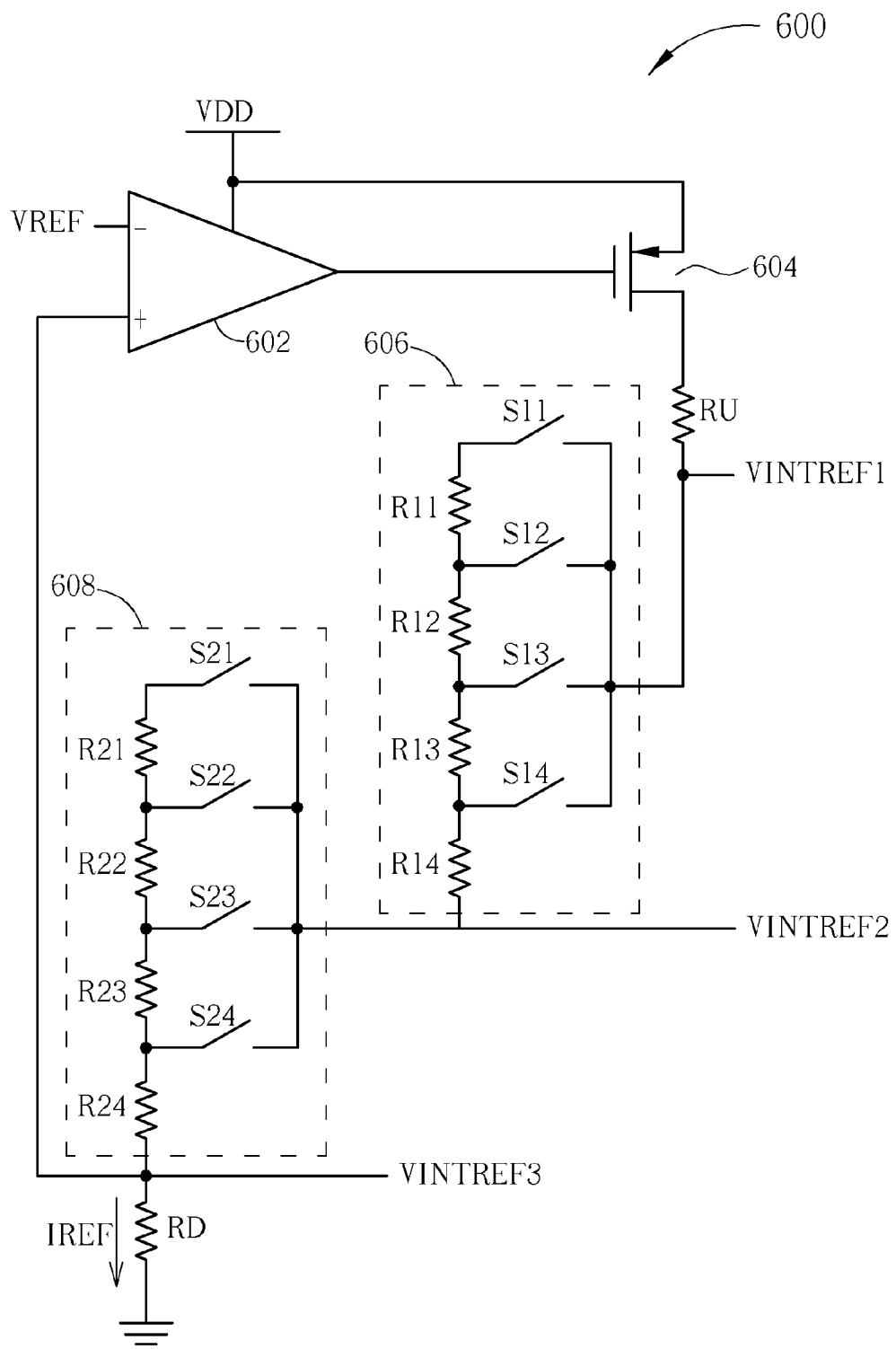
FIG. 6 is a diagram illustrating a variable voltage generation circuit according to another embodiment.

Please refer to FIG. 6. FIG. 6 is a diagram illustrating a variable voltage generation circuit 600 according to another embodiment. The variable voltage generation circuit 600 includes an amplifier 602, a P-type metal-oxide-semiconductor transistor 604, an upper resistor RU, a lower resistor RD, and two variable resistors 606, 608. The amplifier 602 has a first input terminal for receiving a first voltage VDD, a second input terminal for receiving a reference voltage VREF, a third input terminal, and an output terminal. The P-type metal-oxide-semiconductor transistor 604 has a first terminal for receiving the first voltage VDD, a second terminal coupled to the output terminal of the amplifier 602, and a third terminal. The upper resistor RU has a first terminal coupled to the third terminal of the P-type metal-oxide-semiconductor transistor 604, and a second terminal for outputting a first variable voltage VINTREF1, where a resistance of the upper resistor RU can be zero. The lower resistor RD has a first terminal coupled to the third input terminal of the amplifier 602, and a second terminal coupled to ground. The variable resistor 606 has a first terminal coupled to the second terminal of the upper resistor RU, and a second terminal for outputting a second variable voltage VINTREF2. The variable resistor 608 has a first terminal coupled to the second terminal of the variable resistor 606, and a second terminal coupled to the third input terminal of the amplifier 602 for outputting a third variable voltage VINTREF3. In addition, the variable resistor 606 includes a first switch S11, a second switch S12, a third switch S13, a fourth switch S14, and a first resistor R11, a second resistor R12, a third resistor R13, a fourth resistor R14. The variable resistor 606 is the same as the variable resistor 206, so further description thereof is omitted for simplicity. In addition, the variable resistor 608 includes a first switch S21, a second switch S22, a third switch S23, a fourth switch S24, and a first resistor R21, a second resistor R22, a third resistor R23, a fourth resistor R24, where resistances of the first resistor R21, the second resistor R22, the third resistor R23, the fourth resistor R24 are the same, not all the same, or different. Coupling relationships between the first switch S21, the second switch S22, the third switch S23, the fourth switch S24, and the first resistor R21, the second resistor R22, the third resistor R23, the fourth resistor R24 of the variable resistor 608 are the same as coupling relationships between the 4 switches S11-S14 and the 4 resistors R11-R14 of the variable resistor 606, so further description thereof is omitted for simplicity. But, the variable resistors 606, 608 of the present invention are not limited to 4 switches and 4 resistors. Any number of switches and resistors of the variable resistors 606, 608 greater than two or equal to two falls within the scope of the present invention.

A reference current IREF of the variable voltage generation circuit 600 is determined by equation (3). In FIG. 6, when the first switch S11 is turned on, the second switch S12, the third switch S13, and the fourth switch S14 are turned off, and the first switch S21 is turned on, the second switch S22, the third switch S23, and the fourth switch S24 are turned off, a first variable voltage VINTREF1, a second variable voltage VINTREF2, and a third variable voltage VINTREF3 are determined by equation (11), equation (12), and equation (13):

$$VINTREF1=IREF*(RD+R11+R12+R13+R14+R21+R22+R23+R24) \qquad (11)$$

$$VINTREF2=IREF*(RD+R21+R22+R23+R24) \qquad (12)$$

$$VINTREF3=IREF*(RD) \qquad (13)$$

Further, subsequent operational principles of other variable voltages of the variable voltage generation circuit 600 are the same as the first variable voltage VINTREF1, the second variable voltage VINTREF2, and the third variable voltage VINTREF3 when the first switch S11 is turned on, the second switch S12, the third switch S13, and the fourth switch S14 are turned off, and the first switch S21 is turned on, the second switch S22, the third switch S23, and the fourth switch S24 are turned off, so further description thereof is omitted for simplicity.

Figure 7:
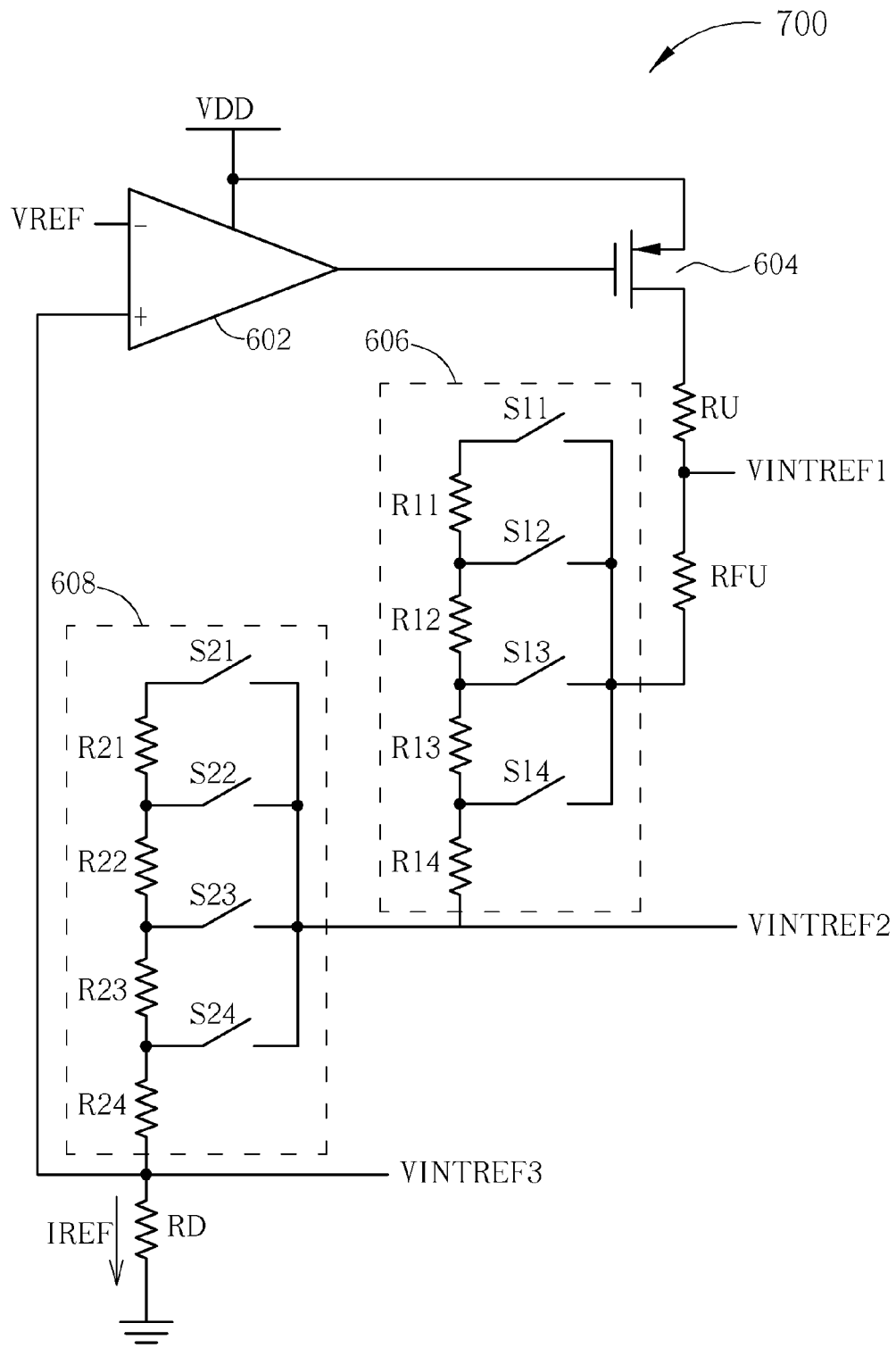
FIG. 7 is a diagram illustrating a variable voltage generation circuit according to another embodiment.

Please refer to FIG. 7. FIG. 7 is a diagram illustrating a variable voltage generation circuit 700 according to another embodiment. A difference between the variable voltage generation circuit 700 and the variable voltage generation circuit 600 is that the variable voltage generation circuit 700 further includes a first upper resistor RFU. The first upper resistor RFU has a first terminal coupled to the second terminal of the upper resistor RU, and a second terminal coupled to the first terminal of the variable resistor 606. Further, subsequent operational principles of the variable voltage generation circuit 700 are the same as those of the variable voltage generation circuit 600, so further description thereof is omitted for simplicity.

Figure 8:
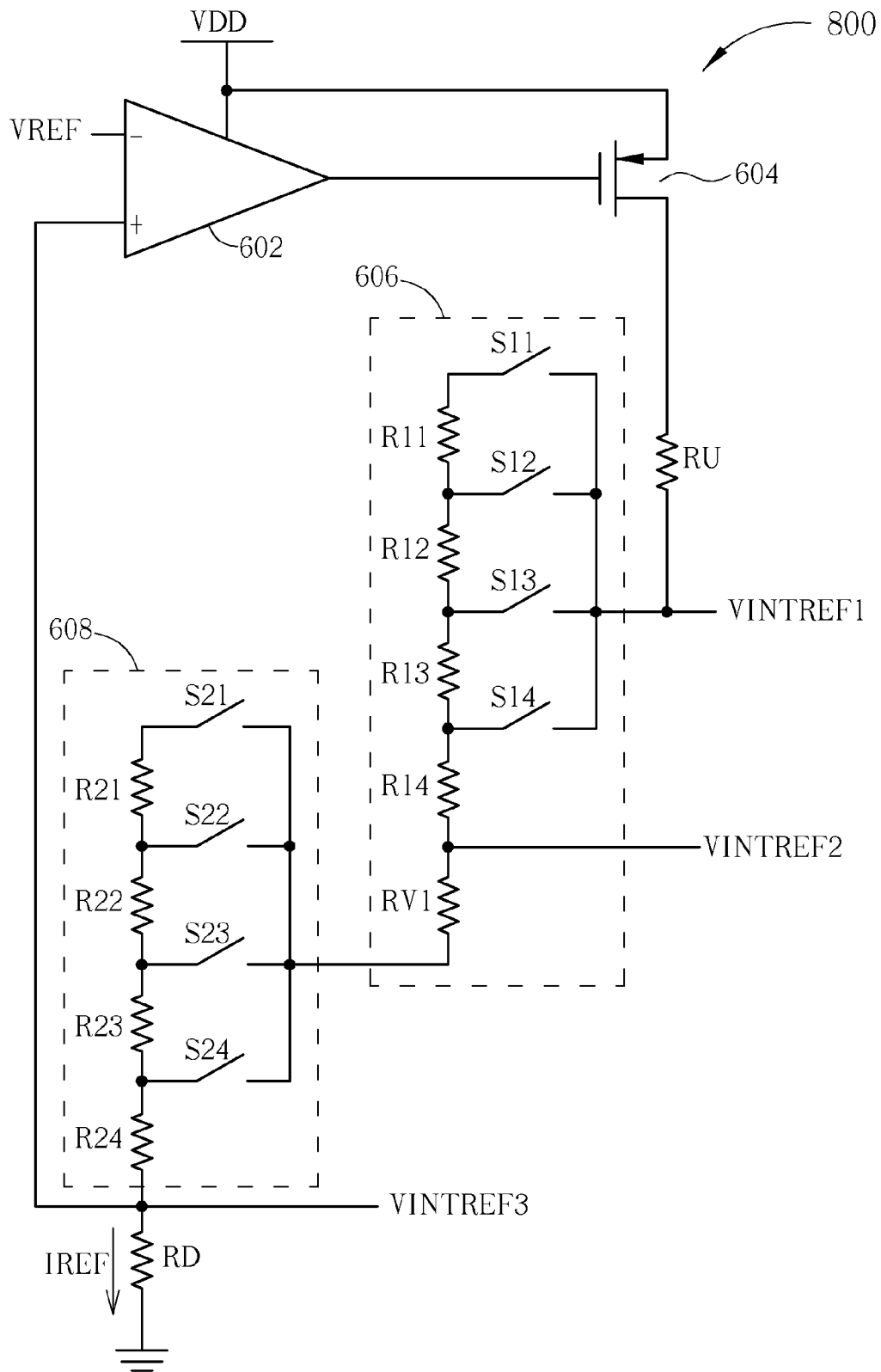
FIG. 8 is a diagram illustrating a variable voltage generation circuit according to another embodiment.

Please refer to FIG. 8. FIG. 8 is a diagram illustrating a variable voltage generation circuit 800 according to another embodiment. A difference between the variable voltage generation circuit 800 and the variable voltage generation circuit 600 is that the variable resistor 606 of the variable voltage generation circuit 800 further includes a resistor RV1. The resistor RV1 has a first terminal coupled to the second terminal of the fourth resistor R14 of the variable resistor 606, and a second terminal coupled to the first terminal of the variable resistor 608. Further, subsequent operational principles of the variable voltage generation circuit 800 are the same as those of the variable voltage generation circuit 600, so further description thereof is omitted for simplicity.

Figure 9:
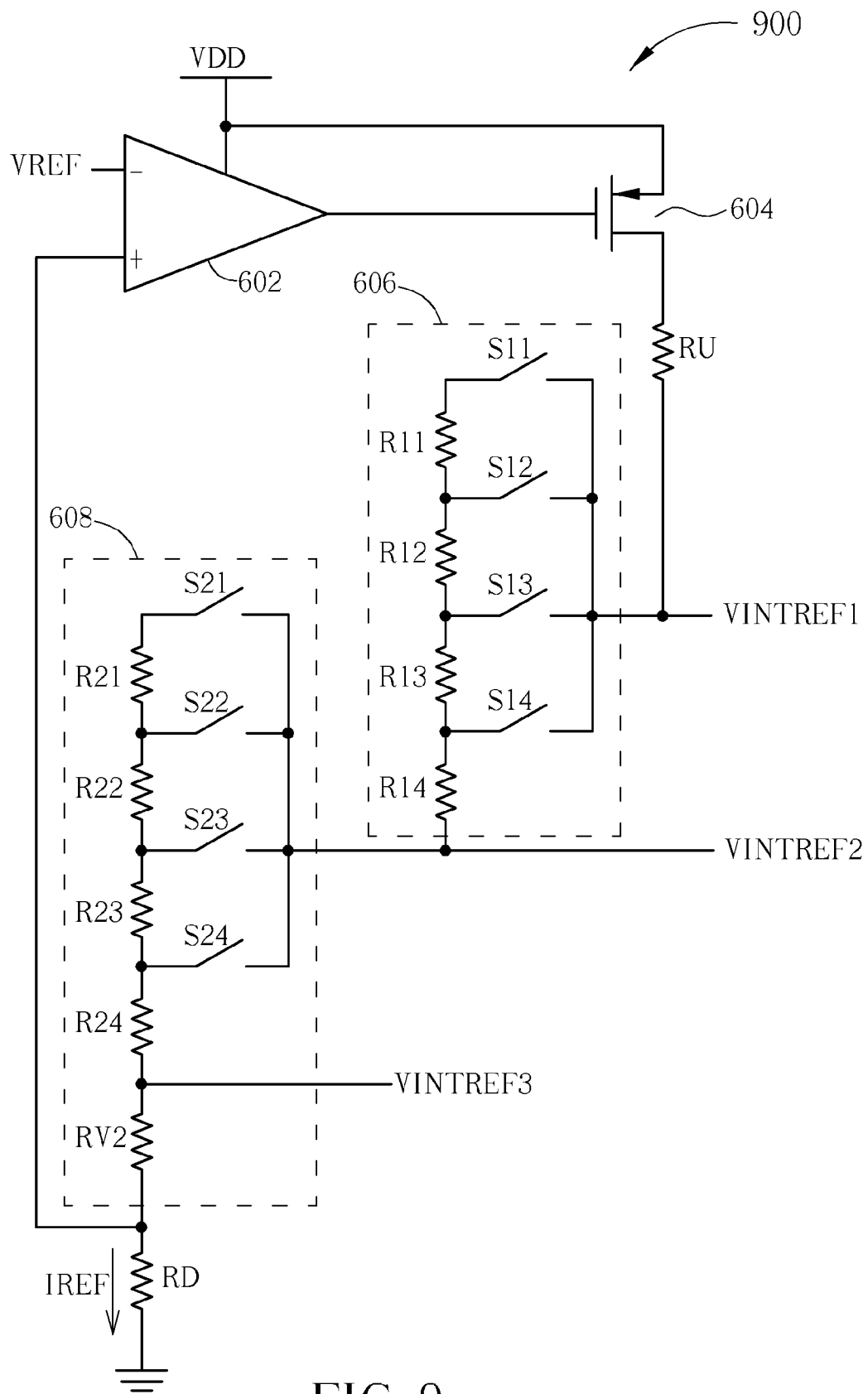
FIG. 9 is a diagram illustrating a variable voltage generation circuit according to another embodiment.

Please refer to FIG. 9. FIG. 9 is a diagram illustrating a variable voltage generation circuit 900 according to another embodiment. A difference between the variable voltage generation circuit 900 and the variable voltage generation circuit 600 is that the variable resistor 608 of the variable voltage generation circuit 900 further includes a resistor RV2. The resistor RV2 has a first terminal coupled to the second terminal of the fourth resistor R24 of the variable resistor 608, and a second terminal coupled to the third input terminal of the amplifier 602. Further, subsequent operational principles of the variable voltage generation circuit 900 are the same as those of the variable voltage generation circuit 600, so further description thereof is omitted for simplicity.

Figure 10:
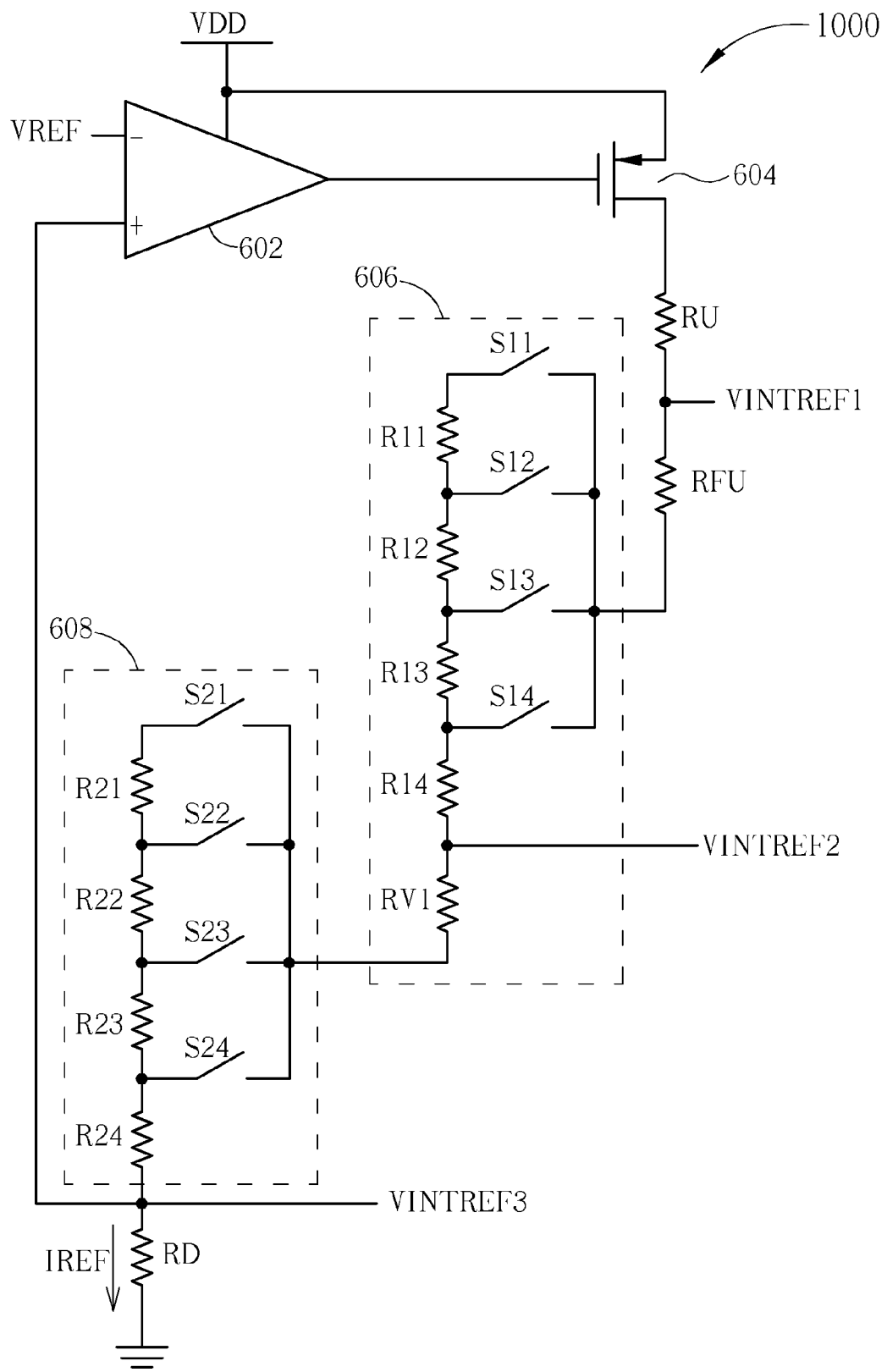
FIG. 10 is a diagram illustrating a variable voltage generation circuit according to another embodiment.

Please refer to FIG. 10. FIG. 10 is a diagram illustrating a variable voltage generation circuit 1000 according to another embodiment. A difference between the variable voltage generation circuit 1000 and the variable voltage generation circuit 600 is that the variable voltage generation circuit 1000 further includes a first upper resistor RFU and the variable resistor 606 of the variable voltage generation circuit 1000 further includes a resistor RV1. The first upper resistor RFU has a first terminal coupled to the second terminal of the upper resistor RU, and a second terminal coupled to the first terminal of the variable resistor 606. The resistor RV1 has a first terminal coupled to the second terminal of the fourth resistor R14 of the variable resistor 606, and a second terminal coupled to the first terminal of the variable resistor 608. Further, subsequent operational principles of the variable voltage generation circuit 1000 are the same as those of the variable voltage generation circuit 600, so further description thereof is omitted for simplicity.

Figure 11:
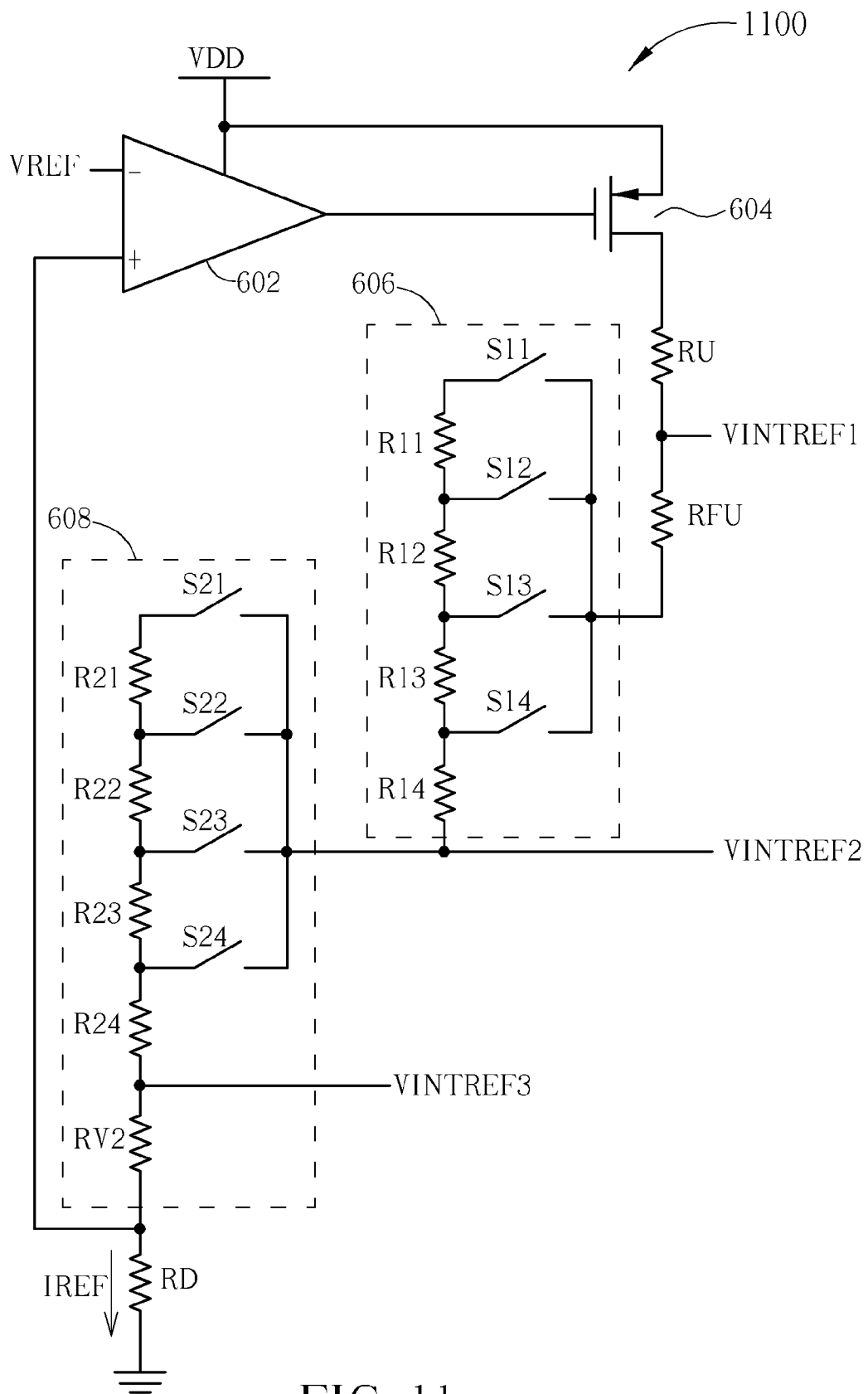
FIG. 11 is a diagram illustrating a variable voltage generation circuit according to another embodiment.

Please refer to FIG. 11. FIG. 11 is a diagram illustrating a variable voltage generation circuit 1100 according to another embodiment. A difference between the variable voltage generation circuit 1100 and the variable voltage generation circuit 600 is that the variable voltage generation circuit 1100 further includes a first upper resistor RFU, and the variable resistor 608 of the variable voltage generation circuit 1100 further includes a resistor RV2. The first upper resistor RFU has a first terminal coupled to the second terminal of the upper resistor RU, and a second terminal coupled to the first terminal of the variable resistor 606. The resistor RV2 has a first terminal coupled to the second terminal of the fourth resistor R24 of the variable resistor 608, and a second terminal coupled to the third input terminal of the amplifier 602. Further, subsequent operational principles of the variable voltage generation circuit 1100 are the same as those of the variable voltage generation circuit 600, so further description thereof is omitted for simplicity.

Figure 12:
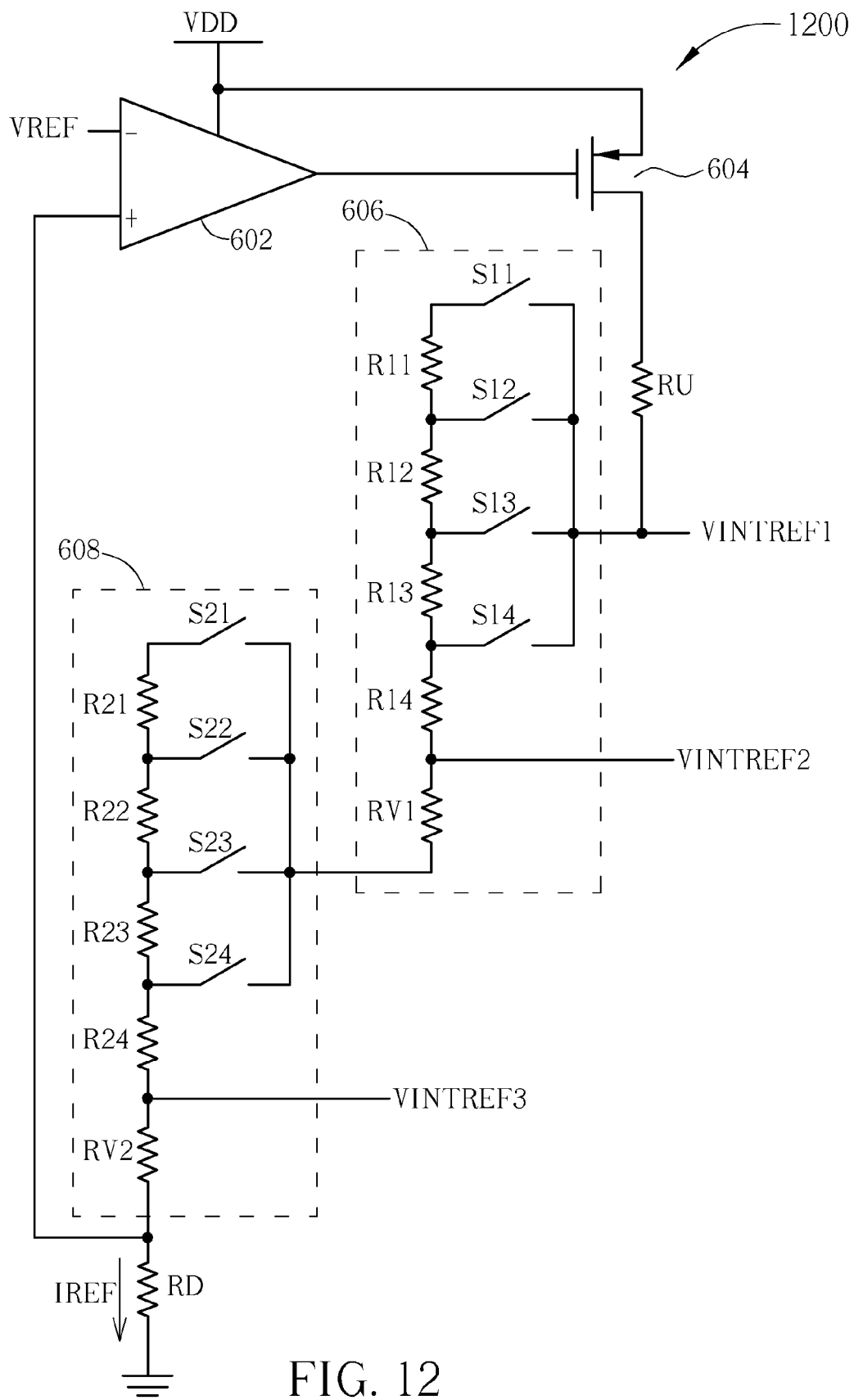
FIG. 12 is a diagram illustrating a variable voltage generation circuit according to another embodiment.

Please refer to FIG. 12. FIG. 12 is a diagram illustrating a variable voltage generation circuit 1200 according to another embodiment. A difference between the variable voltage generation circuit 1200 and the variable voltage generation circuit 600 is that the variable resistor 606 of the variable voltage generation circuit 1200 further includes a resistor RV1, and the variable resistor 608 of the variable voltage generation circuit 1200 further includes a resistor RV2. The resistor RV1 has a first terminal coupled to the second terminal of the fourth resistor R14 of the variable resistor 606, and a second terminal coupled to the first terminal of the variable resistor 608. The resistor RV2 has a first terminal coupled to the second terminal of the fourth resistor R24 of the variable resistor 608, and a second terminal coupled to the third input terminal of the amplifier 602. Further, subsequent operational principles of the variable voltage generation circuit 1200 are the same as those of the variable voltage generation circuit 600, so further description thereof is omitted for simplicity.

Figure 13:
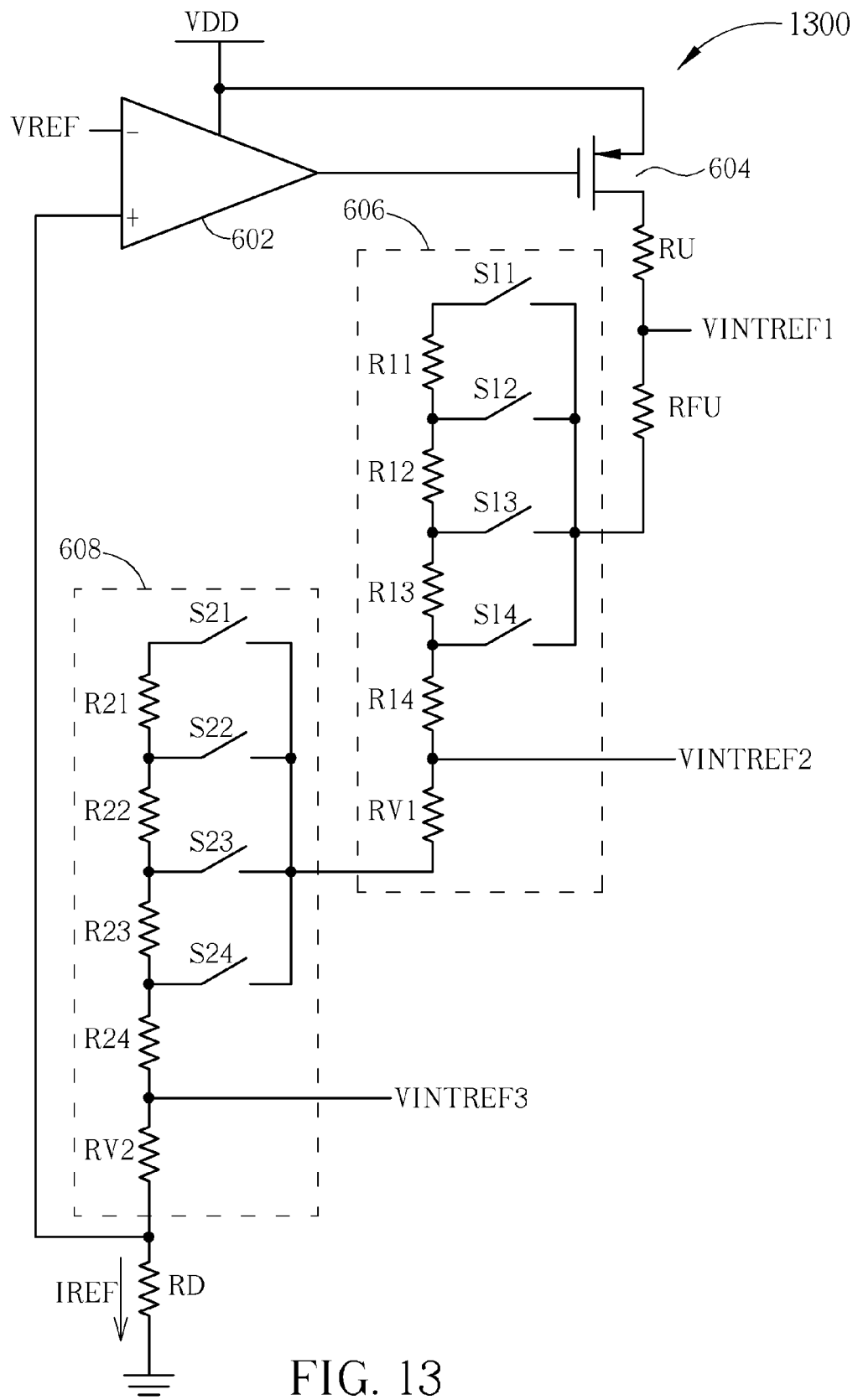
FIG. 13 is a diagram illustrating a variable voltage generation circuit according to another embodiment.

Please refer to FIG. 13. FIG. 13 is a diagram illustrating a variable voltage generation circuit 1300 according to another embodiment. A difference between the variable voltage generation circuit 1300 and the variable voltage generation circuit 600 is that the variable voltage generation circuit 1300 further includes a first upper resistor RFU, the variable resistor 606 of the variable voltage generation circuit 1300 further includes a resistor RV1, and the variable resistor 608 of the variable voltage generation circuit 1300 further includes a resistor RV2. The first upper resistor RFU has a first terminal coupled to the second terminal of the upper resistor RU, and a second terminal coupled to the first terminal of the variable resistor 606. The resistor RV1 has a first terminal coupled to the second terminal of the fourth resistor R14 of the variable resistor 606, and a second terminal coupled to the first terminal of the variable resistor 608. The resistor RV2 has a first terminal coupled to the second terminal of the fourth resistor R24 of the variable resistor 608, and a second terminal coupled to the third input terminal of the amplifier 602. Further, subsequent operational principles of the variable voltage generation circuit 1300 are the same as those of the variable voltage generation circuit 600, so further description thereof is omitted for simplicity.

Figure 14:
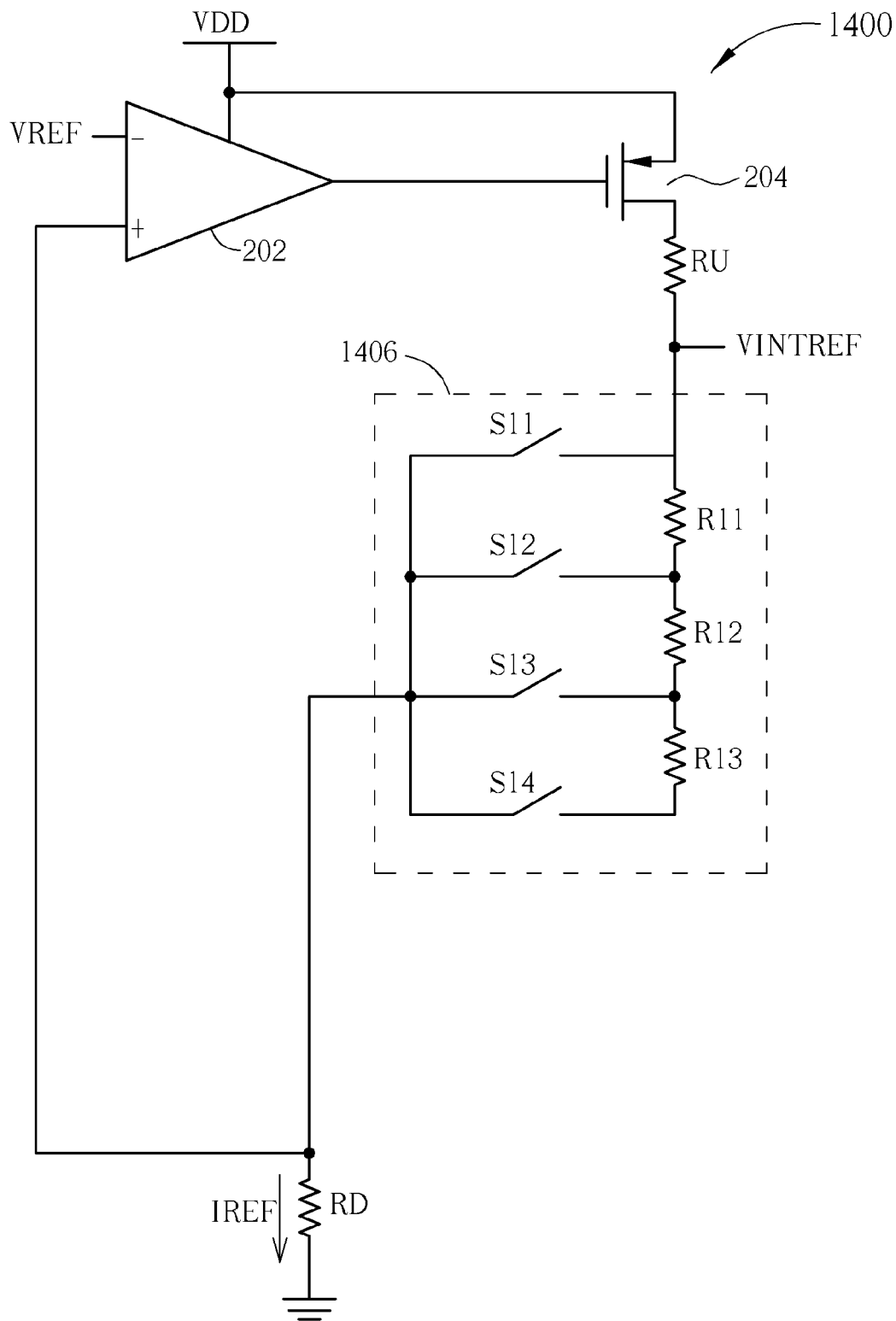
FIG. 14 is a diagram illustrating a variable voltage generation circuit according to another embodiment.

Please refer to FIG. 14. FIG. 14 is a diagram illustrating a variable voltage generation circuit 1400 according to another embodiment. The variable voltage generation circuit 1400 includes an amplifier 202, a P-type metal-oxide-semiconductor transistor 204, an upper resistor RU, a lower resistor RD, and a variable resistor 1406. The amplifier 202 has a first input terminal for receiving a first voltage VDD, a second input terminal for receiving a reference voltage VREF, a third input terminal, and an output terminal. The P-type metal-oxide-semiconductor transistor 204 has a first terminal for receiving the first voltage VDD, a second terminal coupled to the output terminal of the amplifier 202, and a third terminal. The upper resistor RU has a first terminal coupled to the third terminal of the P-type metal-oxide-semiconductor transistor 204, and a second terminal for outputting a variable voltage VINTREF, where a resistance of the upper resistor RU can be zero. The lower resistor RD has a first terminal coupled to the third input terminal of the amplifier 202, and a second terminal coupled to ground. The variable resistor 1406 has a first terminal coupled to the second terminal of the upper resistor RU, and a second terminal coupled to the third input terminal of the amplifier 202. In addition, the variable resistor 1406 includes a first switch S11, a second switch S12, a third switch S13, a fourth switch S14, and a first resistor R11, a second resistor R12, and a third resistor R13. A first terminal of the each switch is coupled to the second terminal of the variable resistor 1406, and resistances of the first resistor R11, the second resistor R12, and the third resistor R13 are the same, not all the same, or different. A second terminal of the first switch S11 is coupled to a first terminal of the first resistor R11, a second terminal of the second switch S12 is coupled to a first terminal of the second resistor R12, a second terminal of the third switch S13 is coupled to a first terminal of the third resistor R13, and a second terminal of the fourth switch S14 is coupled to a second terminal of the third resistor R13. In addition, a second terminal of the first resistor R11 is coupled to the first terminal of the second resistor R12, a second terminal of the second resistor R12 is coupled to the first terminal of the third resistor R13, and the second terminal of the third resistor R13 is coupled to the third input terminal of the amplifier 202. Further, subsequent operational principles of the variable voltage generation circuit 1400 are the same as those of the variable voltage generation circuit 200, so further description thereof is omitted for simplicity.

Figure 15:
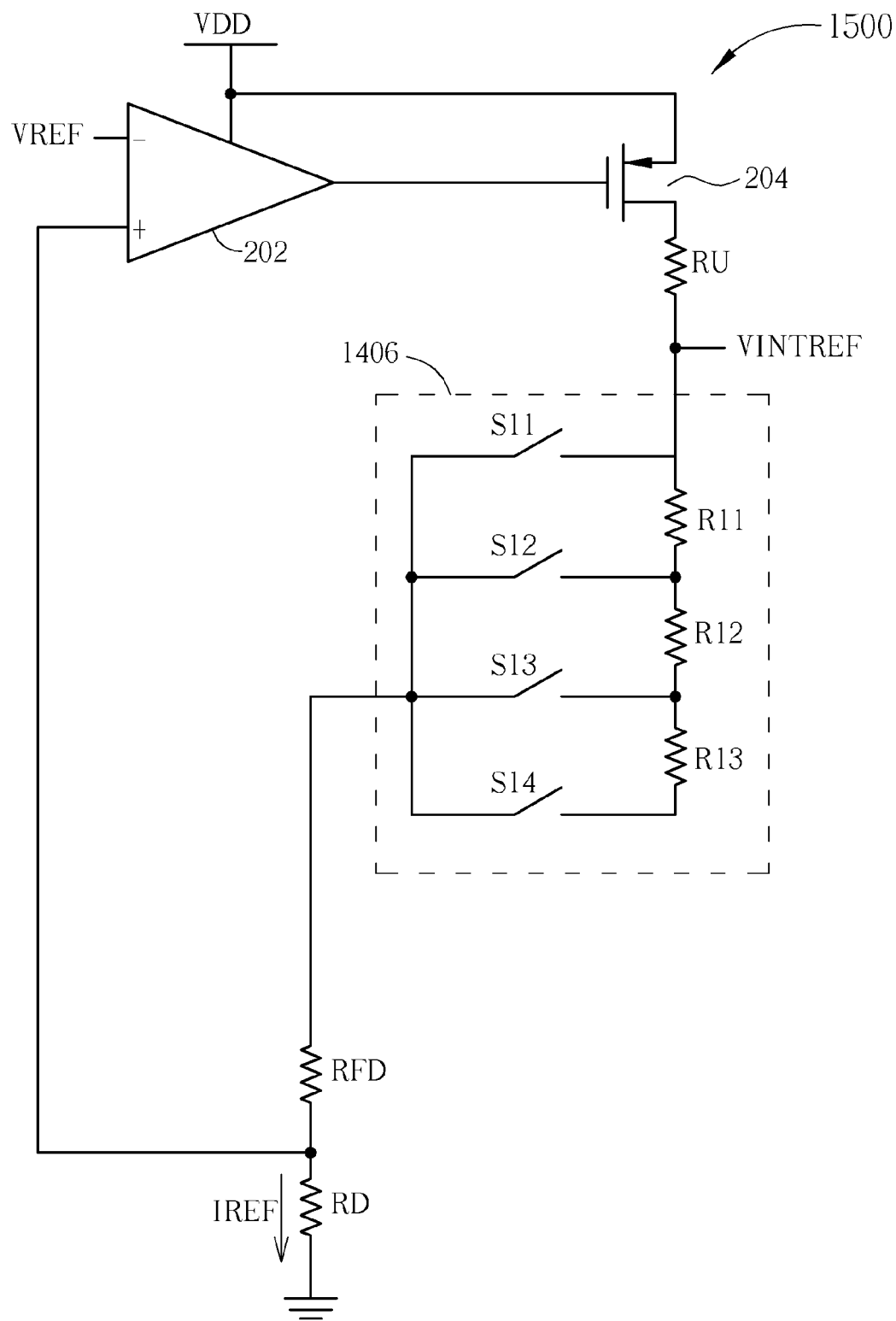
FIG. 15 is a diagram illustrating a variable voltage generation circuit according to another embodiment.

Please refer to FIG. 15. FIG. 15 is a diagram illustrating a variable voltage generation circuit 1500 according to another embodiment. A difference between the variable voltage generation circuit 1500 and the variable voltage generation circuit 1400 is that the variable voltage generation circuit 1500 further includes a first lower resistor RFD. The first lower resistor RFD has a first terminal coupled to the second terminal of the variable resistor 1406, and a second terminal coupled to the first terminal of the lower resistor RD. Further, subsequent operational principles of the variable voltage generation circuit 1500 are the same as those of the variable voltage generation circuit 1400, so further description thereof is omitted for simplicity.

Figure 16:
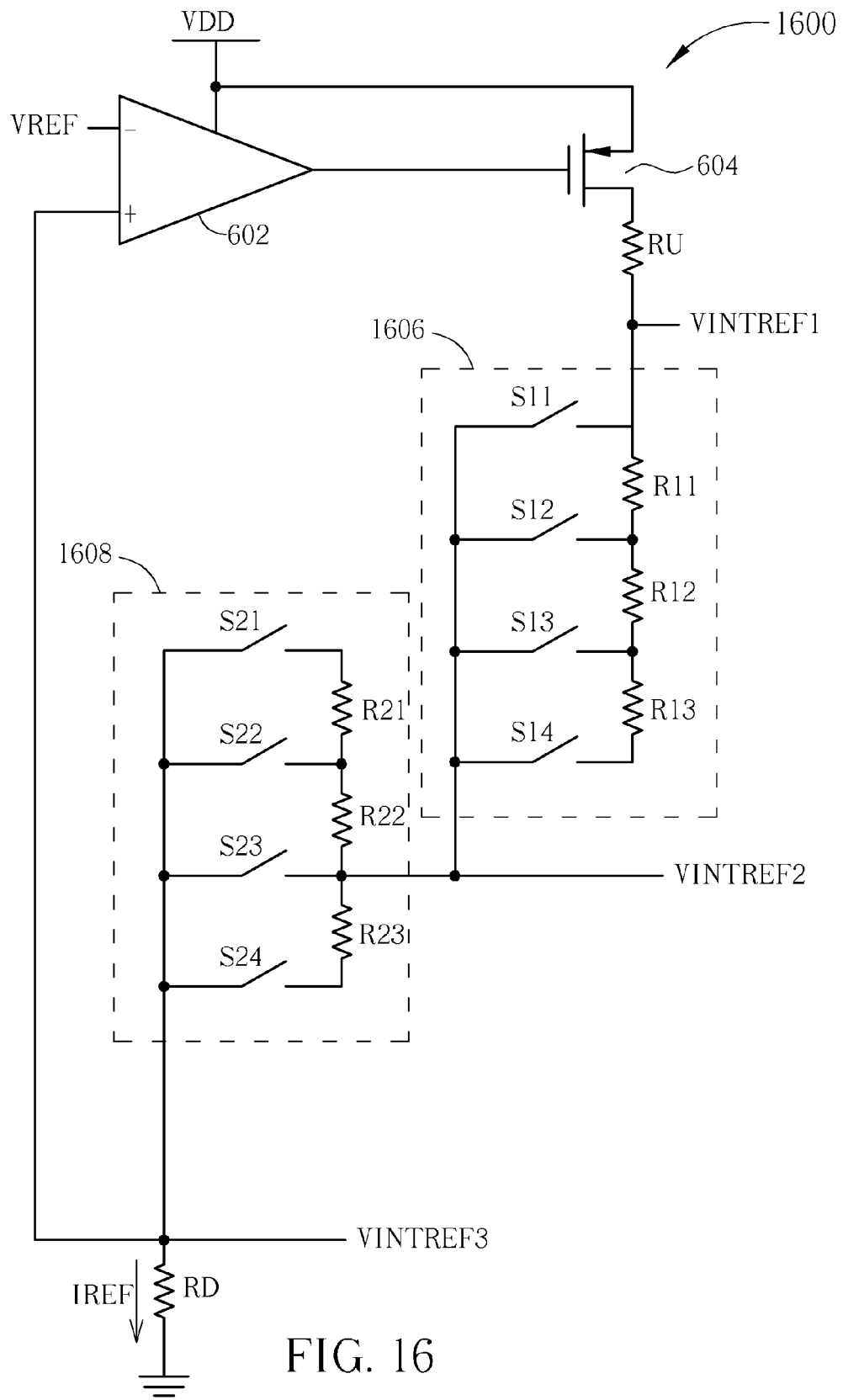
FIG. 16 is a diagram illustrating a variable voltage generation circuit according to another embodiment.

Please refer to FIG. 16. FIG. 16 is a diagram illustrating a variable voltage generation circuit 1600 according to another embodiment. The variable voltage generation circuit 1600 includes an amplifier 602, a P-type metal-oxide-semiconductor transistor 604, an upper resistor RU, a lower resistor RD, and two variable resistors 1606, 1608. The amplifier 602 has a first input terminal for receiving a first voltage VDD, a second input terminal for receiving a reference voltage VREF, a third input terminal, and an output terminal. The P-type metal-oxide-semiconductor transistor 604 has a first terminal for receiving the first voltage VDD, a second terminal coupled to the output terminal of the amplifier 602, and a third terminal. The upper resistor RU has a first terminal coupled to the third terminal of the P-type metal-oxide-semiconductor transistor 604, and a second terminal for outputting a first variable voltage VINTREF1, where a resistance of the upper resistor RU can be zero. The lower resistor RD has a first terminal coupled to the third input terminal of the amplifier 602, and a second terminal coupled to ground. The variable resistor 1606 has a first terminal coupled to the second terminal of the upper resistor RU, and a second terminal for outputting a second variable voltage VINTREF2. The variable resistor 1608 has a first terminal coupled to the second terminal of the variable resistor 1606, and a second terminal coupled to the third input terminal of the amplifier 602 for outputting a third variable voltage VINTREF3. In addition, the variable resistor 1606 includes a first switch S11, a second switch S12, a third switch S13, a fourth switch S14, and a first resistor R11, a second resistor R12, and a third resistor R13. The variable resistor 1606 is the same as the variable resistor 1406, so further description thereof is omitted for simplicity. In addition, the variable resistor 1608 includes a first switch S21, a second switch S22, a third switch S23, a fourth switch S24, and a first resistor R21, a second resistor R22, and a third resistor R23, where resistances of the first resistor R21, the second resistor R22, and the third resistor R23 are the same, not all the same, or different. Coupling relationships between the first switch S21, the second switch S22, the third switch S23, the fourth switch S24, and the first resistor R21, the second resistor R22, and the third resistor R23 of the variable resistor 1608 are the same as coupling relationships between the 4 switches S11-S14 and the 3 resistors R11-R13 of the variable resistor 1606, so further description thereof is omitted for simplicity. But, the variable resistors 1606, 1608 of the present invention are not limited to 4 switches and 3 resistors. Any number of switches and resistors of the variable resistor 1606, 1608 greater than two or equal to two falls within the scope of the present invention. Further, subsequent operational principles of the variable voltage generation circuit 1600 are the same as those of the variable voltage generation circuit 600, so further description thereof is omitted for simplicity.

Figure 17:
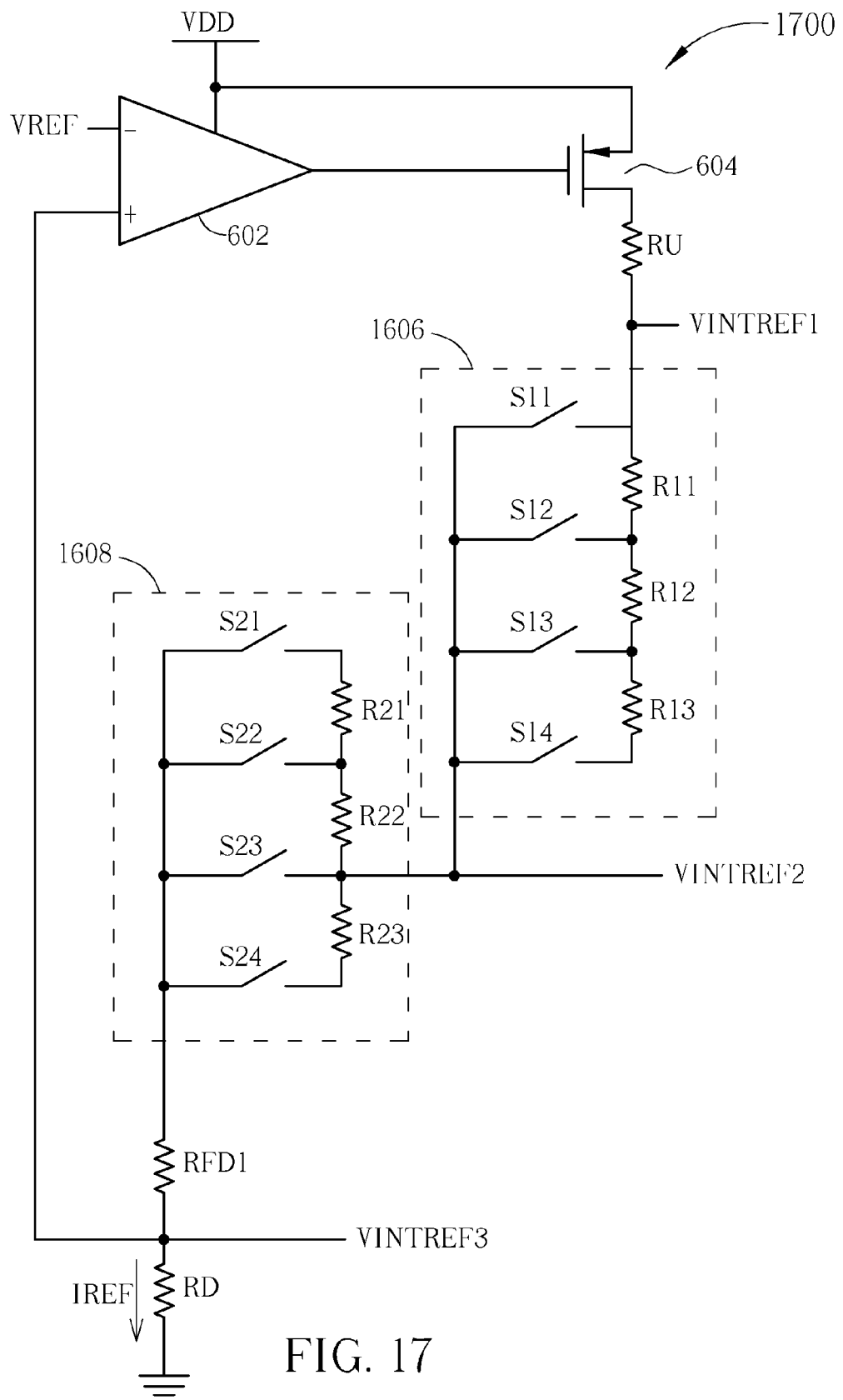
FIG. 17 is a diagram illustrating a variable voltage generation circuit according to another embodiment.

Please refer to FIG. 17. FIG. 17 is a diagram illustrating a variable voltage generation circuit 1600 according to another embodiment. A difference between the variable voltage generation circuit 1700 and the variable voltage generation circuit 1600 is that the variable voltage generation circuit 1700 further includes a first lower resistor RFD1. The first lower resistor RFD1 has a first terminal coupled to the second terminal of the variable resistor 1608, and a second terminal coupled to the first terminal of the lower resistor RD. Further, subsequent operational principles of the variable voltage generation circuit 1700 are the same as those of the variable voltage generation circuit 1600, so further description thereof is omitted for simplicity.

Figure 18:
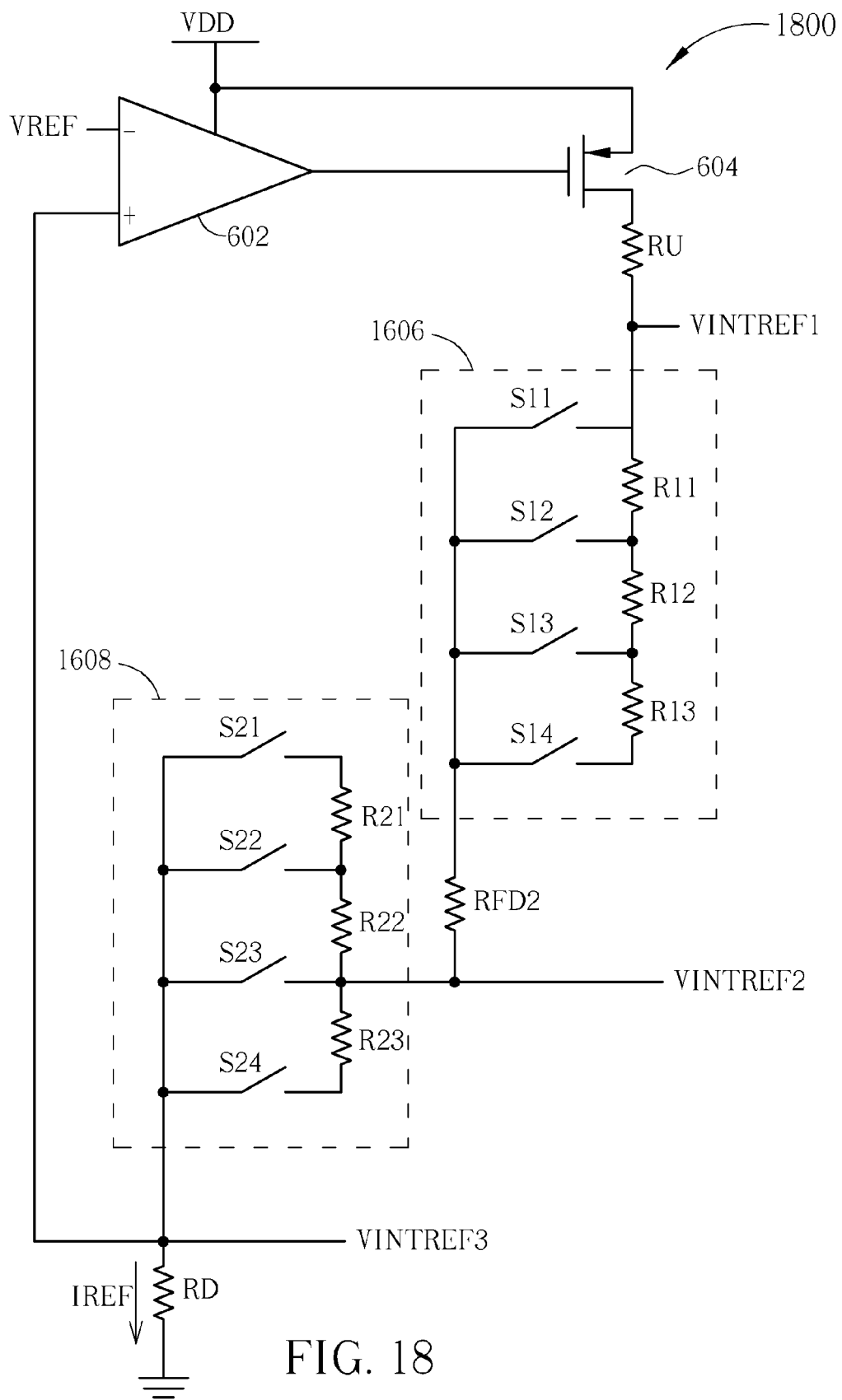
FIG. 18 is a diagram illustrating a variable voltage generation circuit according to another embodiment.

Please refer to FIG. 18. FIG. 18 is a diagram illustrating a variable voltage generation circuit 1800 according to another embodiment. A difference between the variable voltage generation circuit 1800 and the variable voltage generation circuit 1600 is that the variable voltage generation circuit 1800 further includes a first lower resistor RFD2. The first lower resistor RFD2 has a first terminal coupled to the second terminal of the variable resistor 1606, and a second terminal coupled to the first terminal of the variable resistor 1608. Further, subsequent operational principles of the variable voltage generation circuit 1800 are the same as those of the variable voltage generation circuit 1600, so further description thereof is omitted for simplicity.

Figure 19:
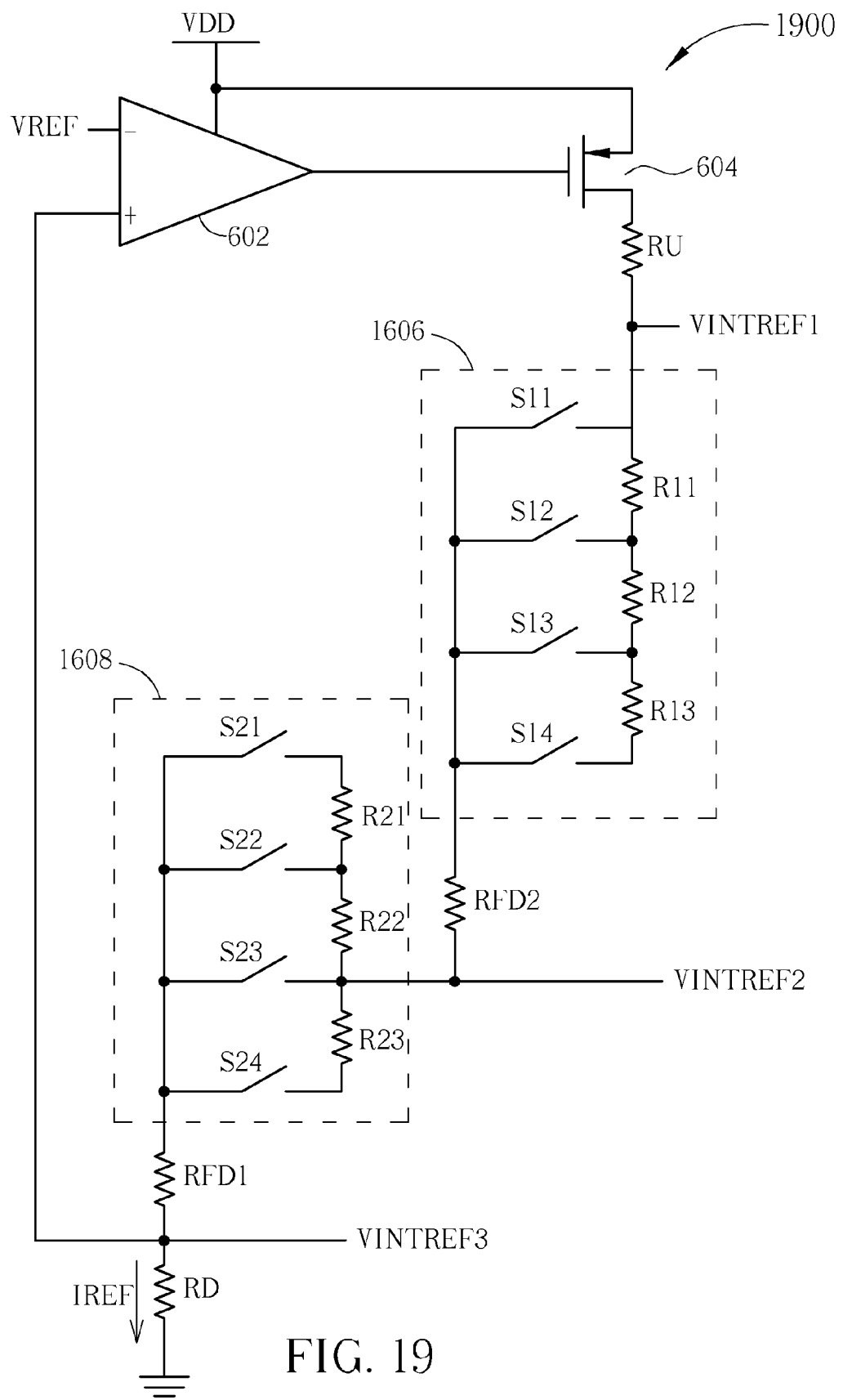
FIG. 19 is a diagram illustrating a variable voltage generation circuit according to another embodiment.

Please refer to FIG. 19. FIG. 19 is a diagram illustrating a variable voltage generation circuit 1900 according to another embodiment. A difference between the variable voltage generation circuit 1900 and the variable voltage generation circuit 1700 is that the variable voltage generation circuit 1900 further includes a first lower resistor RFD2. The first lower resistor RFD2 has a first terminal coupled to the second terminal of the variable resistor 1606, and a second terminal coupled to the first terminal of the variable resistor 1608. Further, subsequent operational principles of the variable voltage generation circuit 1900 are the same as those of the variable voltage generation circuit 1700, so further description thereof is omitted for simplicity.

Figure 20:
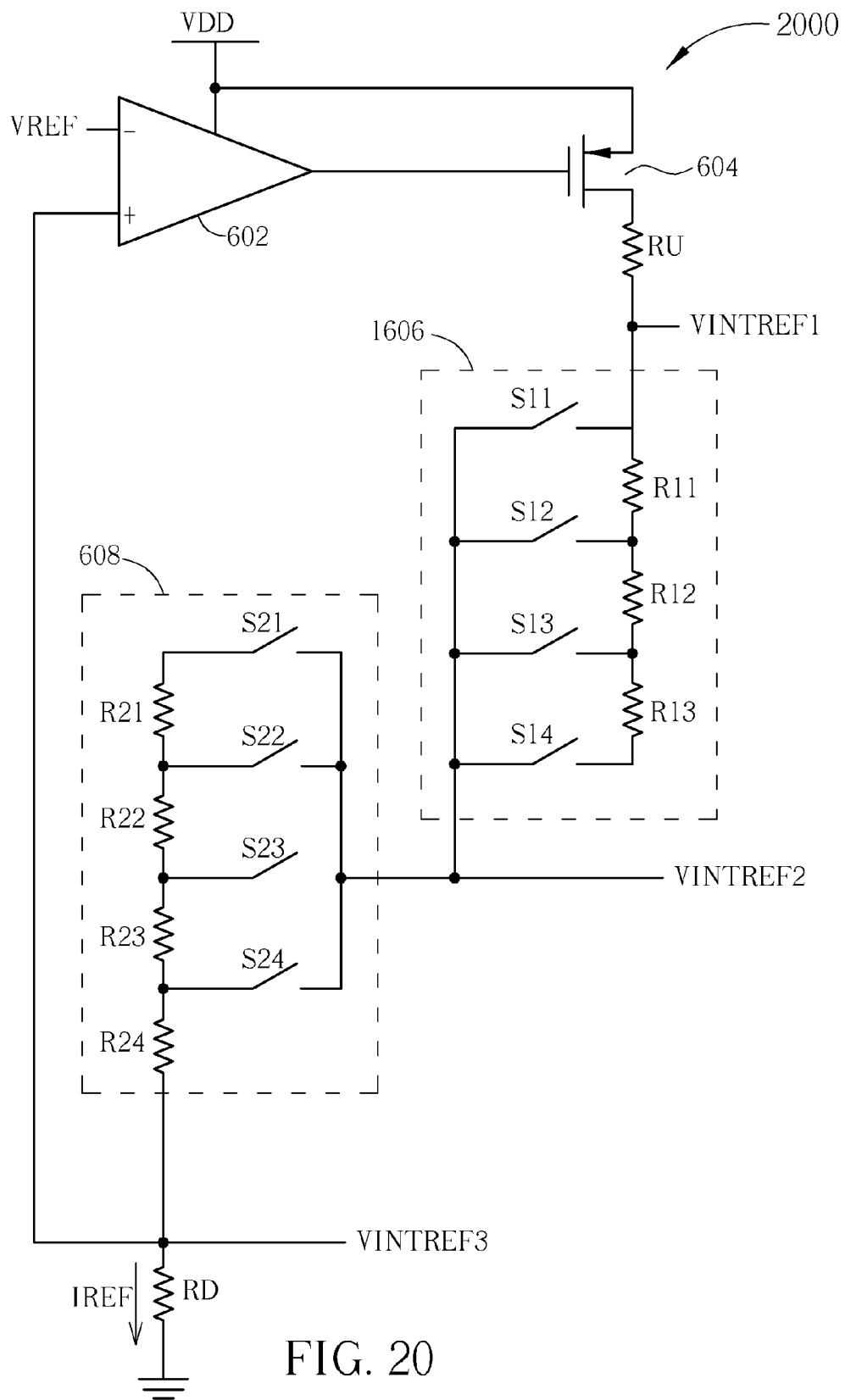
FIG. 20 is a diagram illustrating a variable voltage generation circuit according to another embodiment.

Please refer to FIG. 20. FIG. 20 is a diagram illustrating a variable voltage generation circuit 2000 according to another embodiment. The variable voltage generation circuit 2000 includes an amplifier 602, a P-type metal-oxide-semiconductor transistor 604, an upper resistor RU, a lower resistor RD, and two variable resistors 1606, 608. The amplifier 602 has a first input terminal for receiving a first voltage VDD, a second input terminal for receiving a reference voltage VREF, a third input terminal, and an output terminal. The P-type metal-oxide-semiconductor transistor 604 has a first terminal for receiving the first voltage VDD, a second terminal coupled to the output terminal of the amplifier 602, and a third terminal. The upper resistor RU has a first terminal coupled to the third terminal of the P-type metal-oxide-semiconductor transistor 604, and a second terminal for outputting a first variable voltage VINTREF1, where a resistance of the upper resistor RU can be zero. The lower resistor RD has a first terminal coupled to the third input terminal of the amplifier 602, and a second terminal coupled to ground. The variable resistor 1606 has a first terminal coupled to the second terminal of the upper resistor RU, and a second terminal for outputting a second variable voltage VINTREF2. The variable resistor 608 has a first terminal coupled to the second terminal of the variable resistor 1606, and a second terminal coupled to the third input terminal of the amplifier 602 for outputting a third variable voltage VINTREF3. In addition, The coupling relationships between the first switch S21, the second switch S22, the third switch S23, the fourth switch S24, and the first resistor R21, the second resistor R22, the third resistor R23, and the fourth resistor R24 of the variable resistor 608 are the same as the coupling relationships between the 4 switches S11-S14 and the 4 resistors R11-R14 of the variable resistor 606, so further description thereof is omitted for simplicity. Further, subsequent operational principles of the variable voltage generation circuit 2000 are the same as those of the variable voltage generation circuit 1600, so further description thereof is omitted for simplicity.

Figure 21:
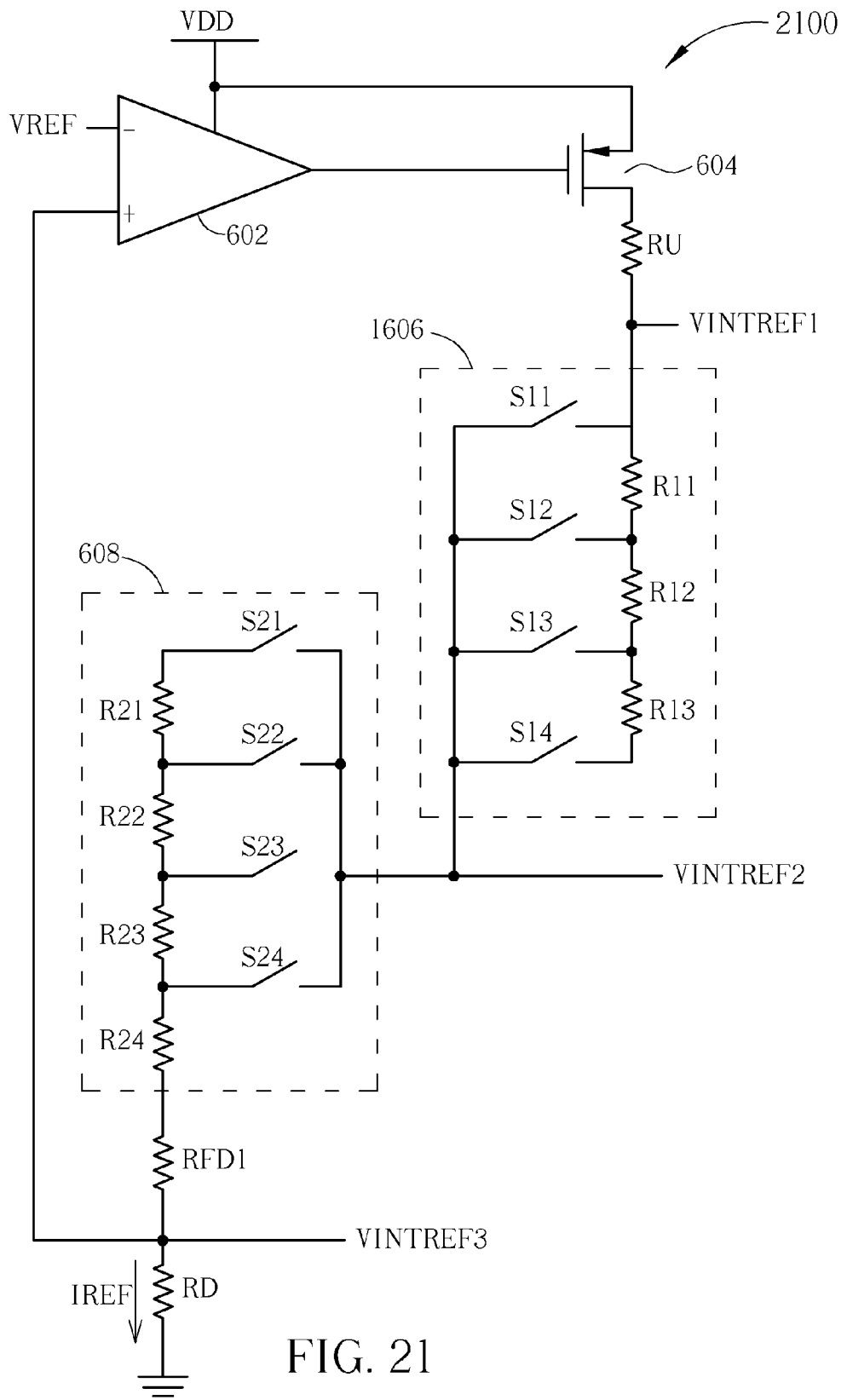
FIG. 21 is a diagram illustrating a variable voltage generation circuit according to another embodiment.

Please refer to FIG. 21. FIG. 21 is a diagram illustrating a variable voltage generation circuit 2100 according to another embodiment. A difference between the variable voltage generation circuit 2100 and the variable voltage generation circuit 2000 is that the variable voltage generation circuit 2100 further includes a first lower resistor RFD1. The first lower resistor RFD1 has a first terminal coupled to the second terminal of the variable resistor 608, and a second terminal coupled to the first terminal of the lower resistor RD. Further, subsequent operational principles of the variable voltage generation circuit 2100 are the same as those of the variable voltage generation circuit 2000, so further description thereof is omitted for simplicity.

Figure 22:
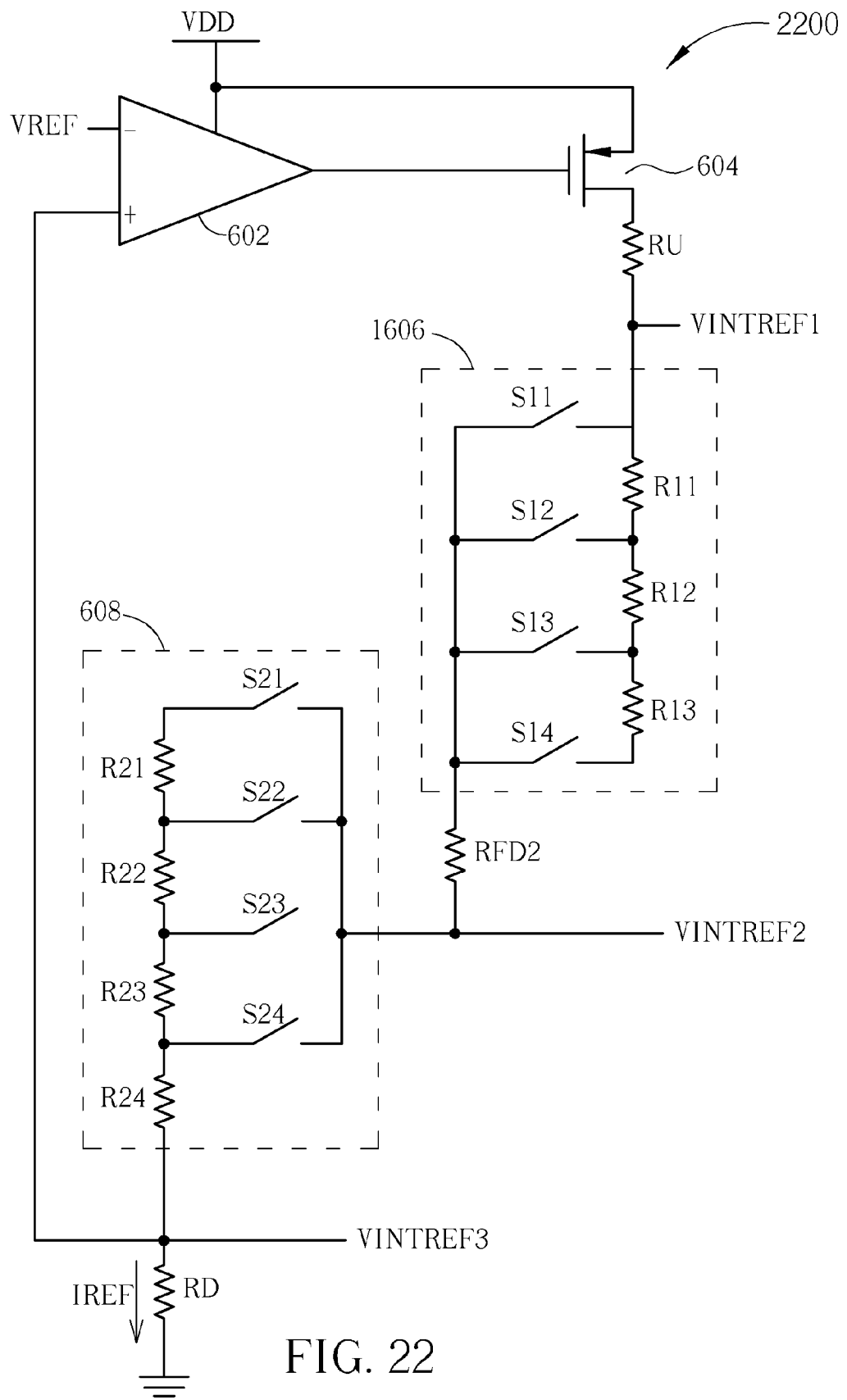
FIG. 22 is a diagram illustrating a variable voltage generation circuit according to another embodiment.

Please refer to FIG. 22. FIG. 22 is a diagram illustrating a variable voltage generation circuit 2200 according to another embodiment. A difference between the variable voltage generation circuit 2200 and the variable voltage generation circuit 2000 is that the variable voltage generation circuit 2200 further includes a first lower resistor RFD2. The first lower resistor RFD2 has a first terminal coupled to the second terminal of the variable resistor 1606, and a second terminal coupled to the first terminal of the variable resistor 608. Further, subsequent operational principles of the variable voltage generation circuit 2200 are the same as those of the variable voltage generation circuit 2000, so further description thereof is omitted for simplicity.

Figure 23:
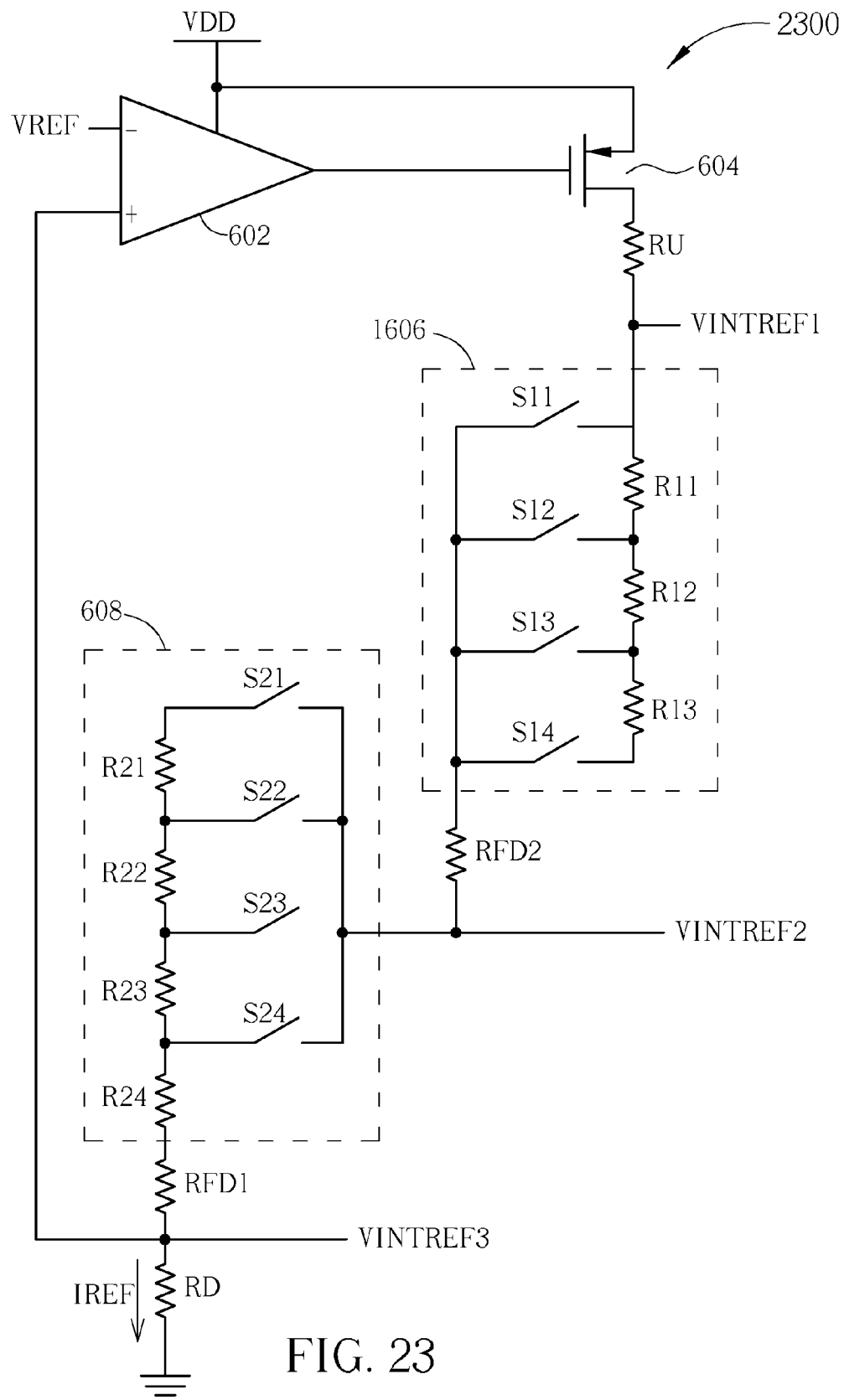
FIG. 23 is a diagram illustrating a variable voltage generation circuit according to another embodiment.

Please refer to FIG. 23. FIG. 23 is a diagram illustrating a variable voltage generation circuit 2300 according to another embodiment. A difference between the variable voltage generation circuit 2300 and the variable voltage generation circuit 2100 is that the variable voltage generation circuit 2300 further includes a first lower resistor RFD2. The first lower resistor RFD2 has a first terminal coupled to the second terminal of the variable resistor 1606, and a second terminal coupled to the first terminal of the variable resistor 608. Further, subsequent operational principles of the variable voltage generation circuit 2300 are the same as those of the variable voltage generation circuit 2100, so further description thereof is omitted for simplicity.

In addition, in FIG. 20, FIG. 21, FIG. 22, and FIG. 23, relative locations of the variable resistor 1606 and the variable resistor 608 can change relative to each other. That is to say, the first terminal of the variable resistor 608 is coupled to the second terminal of the upper resistor RU, and the second terminal of the variable resistor 608 is used for outputting the second variable voltage VINTREF2. The first terminal of the variable resistor 1606 is coupled to the second terminal of the variable resistor 608, and the second terminal of the variable resistor 1606 is coupled to the third input terminal of the amplifier 602 for outputting the third variable voltage VINTREF3.

However, the present invention is not limited to one variable resistor or two variable resistors. Any variable voltage generation circuit including at least one variable resistor falls within the scope of the present invention.

To sum up, the variable voltage generation circuit utilizes at least two parallel switches to choose resistance of at least one variable resistor for generating at least one variable voltage. Therefore, the present invention can improve on the disadvantage in the prior art of the at least one variable voltage varying with semiconductor process variation, voltage, and temperature due to each resistor being in parallel with a switch, thereby reducing influence of internal resistance of each switch, and generating the at least one variable voltage simultaneously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A variable voltage generation circuit, comprising:
an amplifier having a first input terminal for receiving a first voltage, a second input terminal for receiving a reference voltage, a third input terminal, and an output terminal;
a P-type metal-oxide-semiconductor transistor having a first terminal for receiving the first voltage, a second terminal coupled to the output terminal of the amplifier, and a third terminal;
a first variable resistor having a first terminal coupled to the third terminal of the P-type metal-oxide-semiconductor transistor for outputting a first variable voltage, and a second terminal coupled to the third input terminal of the amplifier, wherein the first variable resistor comprises:
  M resistors, wherein the M resistors are arranged in series; and
  M switches, wherein an $i^{th}$ switch of the M switches has a first terminal coupled to the first terminal of the first variable resistor, and a second terminal, wherein an $i^{th}$ resistor of the M resistors has a first terminal coupled to the second terminal of the $i^{th}$ switch, and a second terminal coupled to a second terminal of an $(i+1)^{th}$ switch;
  wherein a second terminal of an $M^{th}$ resistor is coupled to the second terminal of the first variable resistor, $2 \leq M$, $1 \leq i < M$, and i and M are natural numbers;
  wherein the M switches are arranged in parallel with each other, the $i^{th}$ switch and the $i^{th}$ resistor are not arranged in parallel when the $i^{th}$ switch is turned on; and
a lower resistor having a first terminal coupled to the third input terminal of the amplifier, and a second terminal coupled to ground, wherein turning-on of the $i^{th}$ switch of the M switches acts as a current path for a reference current flowing from the $i^{th}$ resistor to the $M^{th}$ resistor and further to the lower resistor to change the first variable voltage.

2. The variable voltage generation circuit of claim 1, further comprising:
a second variable resistor having a first terminal coupled to the second terminal of the first variable resistor for outputting a second variable voltage, and a second terminal coupled to the third input terminal of the amplifier for outputting a third variable voltage, wherein the second variable resistor comprises:
  N resistors; and
  N switches, wherein an $j^{th}$ switch of the N switches has a first terminal coupled to the first terminal of the second variable resistor, and a second terminal, wherein an $j^{th}$ resistor of the N resistors has a first terminal coupled to the second terminal of the $j^{th}$ switch, and a second terminal is coupled to a second terminal of an $(j+1)^{th}$ switch;
  wherein a second terminal of an $N^{th}$ resistor is coupled to the second terminal of the second variable resistor, $2 \leq N$, $1 \leq j < N$, and j and N are natural numbers.

3. The variable voltage generation circuit of claim 2, wherein the second variable resistor further comprises:
a resistor coupled between the second terminal of the $N^{th}$ resistor and the second terminal of the second variable resistor.

4. The variable voltage generation circuit of claim 2, further comprising:

at least one first lower resistor having a first terminal coupled to the second terminal of the second variable resistor, and a second terminal coupled to the first terminal of the lower resistor.

5. The variable voltage generation circuit of claim 2, wherein resistances of the N resistors are the same, not all the same, or different.

6. The variable voltage generation circuit of claim 1, further comprising:
at least one first lower resistor having a first terminal coupled to the second terminal of the first variable resistor, and a second terminal coupled to the first terminal of the lower resistor.

7. The variable voltage generation circuit of claim 1, wherein the first variable resistor further comprises:
a resistor coupled between the second terminal of the $M^{th}$ resistor and the second terminal of the first variable resistor.

8. The variable voltage generation circuit of claim 1, wherein resistances of the M resistors are the same, not all the same, or different.

9. A variable voltage generation circuit, comprising:
an amplifier having a first input terminal for receiving a first voltage, a second input terminal for receiving a reference voltage, a third input terminal, and an output terminal;
a P-type metal-oxide-semiconductor transistor having a first terminal for receiving the first voltage, a second terminal coupled to the output terminal of the amplifier, and a third terminal;
a first variable resistor having a first terminal coupled to the third terminal of the P-type metal-oxide-semiconductor transistor for outputting a first variable voltage, and a second terminal coupled to the third input terminal of the amplifier, wherein the first variable resistor comprises:
M−1 resistors, wherein the M−1 resistors are arranged in series; and
M switches, wherein an $i^{th}$ switch of the M switches has a first terminal coupled to the second terminal of the first variable resistor, and a second terminal, wherein an $i^{th}$ resistor of the M−1 resistors has a first terminal coupled to the second terminal of the $i^{th}$ switch, and a second terminal coupled to a second terminal of an $(i+1)^{th}$ switch;
wherein a first terminal of a first resistor of the M−1 resistors is coupled to the first terminal of the first variable resistor, a first terminal of an $M^{th}$ switch is coupled to the second terminal of the first variable resistor, $2 \leq M$, $1 \leq i \leq M-1$, and i and M are natural numbers;
wherein the M switches are arranged in parallel with each other, the $i^{th}$ switch and the $i^{th}$ resistor are not arranged in parallel when the $i^{th}$ switch is turned on; and
a lower resistor having a first terminal coupled to the third input terminal of the amplifier, and a second terminal coupled to ground, wherein turning-on of the $i^{th}$ switch of the M switches acts as a current path for a reference current flowing through at least one resistor of the M−1 resistor and the lower resistor to change the first variable voltage.

10. The variable voltage generation circuit of claim 9, further comprising:
a second variable resistor having a first terminal coupled to the second terminal of the first variable resistor for outputting a second variable voltage, and a second terminal coupled to the third input terminal of the amplifier for outputting a third variable voltage, wherein the second variable resistor comprises:
N−1 resistors; and
N switches, wherein an $j^{th}$ switch of the N switch has a first terminal coupled to the second terminal of the second variable resistor, and a second terminal, wherein an $j^{th}$ resistor of the N−1 resistors has a first terminal coupled to the second terminal of the $j^{th}$ switch, and a second terminal coupled to a second terminal of an $(j+1)^{th}$ switch;
wherein a first terminal of an $j^{th}$ resistor is coupled to the first terminal of the second variable resistor, a first terminal of an $N^{th}$ switch is coupled to the second terminal of the second variable resistor, $2 \leq N$, $1 \leq j \leq N-1$, and j and N are natural numbers.

11. The variable voltage generation circuit of claim 10, further comprising:
at least one first lower resistor having a first terminal coupled to the second terminal of the second variable resistor, and a second terminal coupled to the first terminal of the lower resistor.

12. The variable voltage generation circuit of claim 10, wherein the second variable resistor further comprises:
a resistor coupled between the first terminal of the $N^{th}$ switch and the second terminal of the second variable resistor.

13. The variable voltage generation circuit of claim 10, wherein resistances of the N−1 resistors are the same, not all the same, or different.

14. The variable voltage generation circuit of claim 9, further comprising:
a second variable resistor having a first terminal coupled to the second terminal of the first variable resistor for outputting a second variable voltage, and a second terminal coupled to the third input terminal of the amplifier for outputting a third variable voltage, wherein the second variable resistor comprises:
N resistors; and
N switches, wherein a $j^{th}$ switch of the N switches has a first terminal coupled to the first terminal of the second variable resistor, and a second terminal, wherein a $j^{th}$ resistor of the N resistors has a first terminal coupled to the second terminal of the $j^{th}$ switch, and a second terminal coupled to a first terminal of a $(j+1)^{th}$ resistor;
wherein a second terminal of a $j^{th}$ resistor is coupled to the second terminal of the second variable resistor, $2 \leq N$, $1 \leq j \leq N$, and j and N are natural numbers.

15. The variable voltage generation circuit of claim 14, further comprising:
at least one first lower resistor having a first terminal coupled to the second terminal of the second variable resistor, and a second terminal coupled to the first terminal of the lower resistor.

16. The variable voltage generation circuit of claim 14, wherein the second variable resistor further comprises:
a resistor coupled between a second terminal of an $N^{th}$ resistor and the second terminal of the second variable resistor.

17. The variable voltage generation circuit of claim 9, further comprising:
at least one first lower resistor having a first terminal coupled to the second terminal of the first variable resistor, and a second terminal coupled to the first terminal of the lower resistor.

18. The variable voltage generation circuit of claim 9, further comprising:
- at least one upper resistor coupled between the third terminal of the P-type metal-oxide-semiconductor transistor and the first terminal of the first variable resistor.

19. The variable voltage generation circuit of claim 18, further comprising:
- at least one first upper resistor coupled between the upper resistor and the first terminal of the first variable resistor.

20. The variable voltage generation circuit of claim 9, wherein the first variable resistor further comprises:
- a resistor coupled between the first terminal of the $M^{th}$ switch and the second terminal of the first variable resistor.

21. The variable voltage generation circuit of claim 9, wherein resistances of the M−1 resistors are the same, not all the same, or different.

* * * * *